United States Patent [19]

Nishizawa

[11] Patent Number: 4,608,582

[45] Date of Patent: Aug. 26, 1986

[54] SEMICONDUCTOR DEVICE HAVING NON-SATURATING I-V CHARACTERISTICS AND INTEGRATED CIRCUIT STRUCTURE INCLUDING SAME

[75] Inventor: Jun-ichi Nishizawa, Sendai, Japan

[73] Assignee: Zaidan Hojin Handotai Kenkyu Shinkokai, Miyagi, Japan

[21] Appl. No.: 515,462

[22] Filed: Jul. 20, 1983

Related U.S. Application Data

[63] Continuation of Ser. No. 220,122, Dec. 24, 1980, abandoned, which is a continuation of Ser. No. 873,903, Jan. 31, 1978, abandoned.

[30] Foreign Application Priority Data

Feb. 2, 1977 [JP] Japan .................................. 52-10460
Feb. 15, 1977 [JP] Japan .................................. 52-15880
Feb. 18, 1977 [JP] Japan .................................. 52-17327
Feb. 24, 1977 [JP] Japan .................................. 52-19466

[51] Int. Cl.$^4$ ............................................ H01L 29/80
[52] U.S. Cl. ........................................ 357/22; 357/41; 357/43; 357/46; 357/55; 357/92
[58] Field of Search ..................... 357/22, 92, 41, 43, 357/46, 55

[56] References Cited

U.S. PATENT DOCUMENTS

Re. 29,971  7/1972  Nishizawa et al. .................. 357/22
3,808,515  4/1974  Davis et al. ......................... 357/22
4,115,797  9/1978  Hingarh et al. ...................... 357/92

Primary Examiner—Edward J. Wojciechowicz
Attorney, Agent, or Firm—Cushman, Darby & Cushman

[57] ABSTRACT

The new kind of field effect transistor having a non-saturating characteristic, i.e. static induction transistor (SIT), proposed by the present inventor is modified to serve as a substitute of any conventional bipolar transistor in a given circuitry. That is, the gate-to-gate distance and the impurity concentration of the channel region of an SIT are so selected that the channel is pinched off by the depletion layer at a predetermined forward gate bias. When the forward gate bias applied is below a certain level, the drain current will increase fundamentally exponentially with an increase of the drain voltage above some threshold voltage, whereas when the gate bias applied is above the certain value, the drain current will increase rapidly with a small increase in the drain voltage.

23 Claims, 52 Drawing Figures

FIG. 1A PRIOR ART
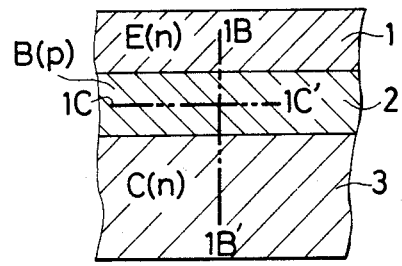
FIG. 1B PRIOR ART    FIG. 1C PRIOR ART
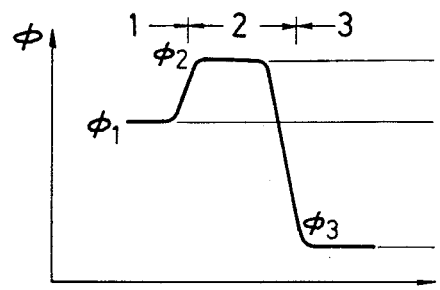 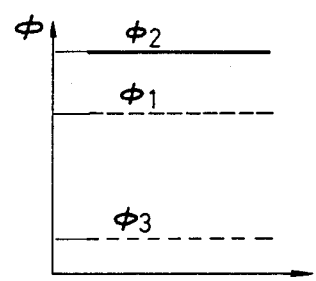
FIG. 2A
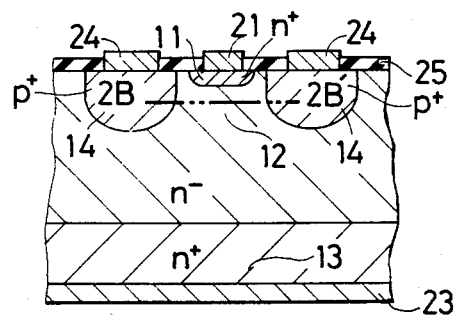
FIG. 2B
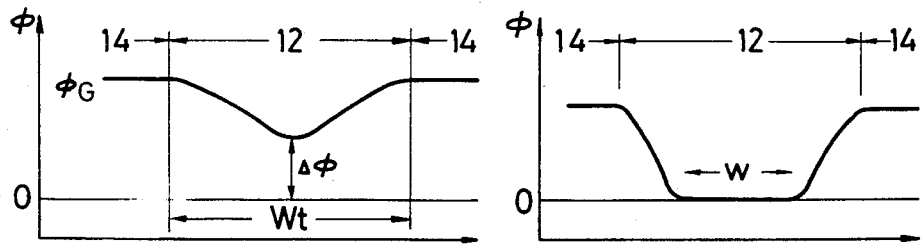

SEMICONDUCTOR DEVICE HAVING NON-SATURATING I-V CHARACTERISTICS AND INTEGRATED CIRCUIT STRUCTURE INCLUDING SAME

This is a continuation of Ser No. 220,122, filed Dec. 24, 1980, which was a continuation of Ser. No. 873,903, filed Jan. 31, 1978, both abandoned.

BACKGROUND OF THE INVENTION (a) Field of the Invention

The present invention relates to a semiconductor device, and more particularly it pertains to a field effect transistor which is suitable for high speed switching operation and which can serve as a substitute of a bipolar transistor, and it further concerns an integrated circuit structure including same.

(b) Description of the Prior Art

Conventional integrated logic circuits having high speed capability are mainly formed with bipolar transistors. Among the known structures, there are integrated injection logic (IIL), emitter-coupled logic (ECL), transistor-transistor logic (TTL), diode-transistor logic (DTL), resistor-transistor logic (RTL), emitter-follower logic (EFL), and non-threshold logic (NTL).

Also bipolar semiconductor memories such as dynamic random access memory (D-RAM), static random access memory (S-RAM), read-only memory (ROM) are known.

Bipolar transistors, however, have such properties that the capacitance formed between the collector and the base and the capacitance formed between the base and the emitter are both large, that the reduction of the base resistance is limited and also that the minority carrier storage effect is unavoidable in a deep saturation operation. These inherent properties of a bipolar transistor undesirably limit the operation speed of the bipolar integrated circuit which is formed with such bipolar transistor. Furthermore, since the power dissipation in a bipolar transistor is relatively large, the power-delay product $p\tau$ is accordingly large theoretically. At the present stage, among the known high speed bipolar integrated logic circuits, TTL, ECL and NTL circuits can exhibit a minimum delay time in the range of from about 0.1 to about 1 nano-sec at the current state of technique, and accompanied at such occation by a power-delay product $p\tau$ of about several to about one hundred pico-joules per gate, whereas IIL provides a minimum power-delay product $p\tau$ in the range of from about 0.1 to about 1 pico-joule per gate, and is accompanied at such an occasion by a delay time $\tau$ being in the order of 50 10 nano-sec. In the semiconductor memories using bipolar transistors, a relatively large power is required for writing and reading addresses for the similar reasons.

The static induction transistor (SIT) proposed by the present invention is fundamentally a kind of unipolar transistor, and has the distinguishing properties that the parasitic capacitances are small, that the gate resistance which may correspond to the base resistance can be very small, that charge carriers are basically drifted by an electric field, that the space charge storage effect is negligibly small, that low noise and high gain operation is possible, and that a non-saturating drain current vs. drain voltage characteristic can be exhibited at least in a portion of the operative range of the transistor irrespective of the magnitude of the gate bias voltage applied, particularly in the reverse gate bias operation. Further information of the static induction transistor may be found in U.S. patent application Ser. Nos. 817,052 filed July 19, 1977, by Nishizawa and 576,541 U.S. Pat. No. Re. 29,971 by Nishizawa et al and in the paper appearing in "IEEE Trans. Electron Devices" ED-22, 185 (1975), which mainly describe the reverse gate bias operation of junction gate SIT. Furthermore, the application of the static induction transistor to integrated circuits, especially of IIL type, was proposed in abandoned U.S. patent application Ser. Nos. 748,292 filed Dec. 7, 1976 and 812,738 filed July 5, 1977. However, the developments of the static induction transistor which have been made heretofore are concentrated mainly on those devices which are operative under a reverse gate bias, and hence such SIT's cannot be substituted for bipolar transistors.

Furthermore, there has also been proposed a bipolar transistor in which the base region is punched through especially at the application of a high collector voltage. This bipolar punch-through transistor shows an unsaturating drain current vs. drain voltage characteristic in same bias condition. However, the punch-through transistor has been considered rather as a faulty product or an impractical device from the usual concept of saturating-type bipolar transistors. Thus, no positive development has been accomplished with respect to the utility of the punch-through transistors.

SUMMARY OF THE INVENTION

It is, therefore, an object of the present invention to provide a semiconductor device of the field effect type having improved characteristics and being capable of performing a high speed switching operation.

Another object of the present invention is to provide a semiconductor device of the field effect type which is able to substitute a bipolar transistor in the conventional semiconductor circuit.

A further object of the present invention is to provide an integrated circuit structure including the improved semiconductor device of the field effect type and having an equivalent circuit similar to a conventional integrated circuit comprising bipolar transistors.

A still further object of the present invention is to provide an integrated circuit structure including a bipolar transistor having a substantially pinched-off and/or punching through base region and being capable of accomplishing an improved high-frequency and high-speed operation.

According to an embodiment of the present invention, there is provided a semiconductor device comprising a semiconductor region of one conductivity type including a current channel region of a low impurity concentration, current injecting and extracting electrode means connected to the ends of said current channel region, and control electrode means provided adjacent to said current channel region and adapted to be applied with a control voltage for defining a current channel in said current channel region, the improvement comprising: said current channel region having such a width and an impurity concentration that will cause the current channel region to be substantially pinched off at the application of a forward controlling voltage, to provide a potential barrier in the current channel for charge carriers travelling from said carrier injecting electrode at a zero gate bias operation, and that will allow the height of the potential barrier to be capacitively controllable by voltages applied to said carrier extracting electrode and said current controlling electrode.

This semiconductor device provides a very high speed operation and is capable of substituting any bipolar transistor in a given circuitry.

According to another embodiment of the present invention, there is provided a semiconductor integrated circuit structure comprising a multiplicity of semiconductor elements at least one of which comprises a semiconductor region including a current channel region of a low impurity concentration, carrier injecting and extracting electrodes connected to the ends of said current channel region and control electrode means provided adjacent to said current channel region and adapted to be applied with a control voltage for defining a current channel in said current channel region, said current channel region having such a width and an impurity concentration that will cause the current channel region to be substantially pinched off at a forward controlling voltage to provide a potential barrier in the current channel for charge carriers travelling from said carrier injecting electrode in a main operative state of the transistor and that will allow the height of the potential barrier to be capacitively controllable by voltages applied to said carrier extracting electrode by said current control electrode.

These and other objects, as well as the features and the advantages of the present invention will become more apparent from the following description of the embodiments of the present invention when taken in conjunction with the accompanying drawings.

BRIEF DESCRIPTION OF THE DRAWINGS

FIG. 1A is a diagrammatic cross-section of a conventional bipolar transistor.

FIGS. 1B and 1C are diagrams showing potential distribution along the lines 1B—1B' and 1C—1C' in the bipolar transistor of FIG. 1A. FIG. 2A is a diagrammatic cross-section illustrating a semiconductor device according to an embodiment of the present invention.

FIG. 2B is diagrams showing the potential distribution along the line 2B—2B' in the semiconductor device of FIG. 2A in two operational modes.

DETAILED DESCRIPTION OF THE PREFERRED EMBODIMENTS

Figure 3:
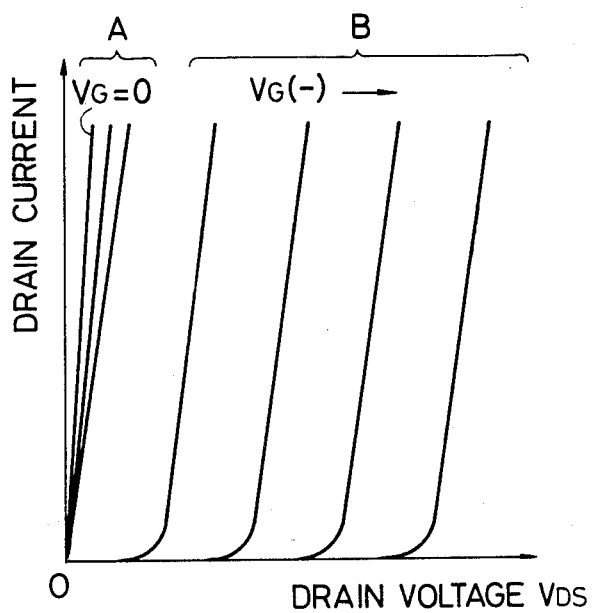
FIGS. 3 and 4 are diagrams of drain current vs. drain voltage characteristic curves achievable by the semiconductor device of FIG. 2A.

The static induction transistor (SIT) may be defined broadly as a field effect transistor having a current path between a carrier injecting region (source) and a carrier extracting region (drain) and a potential barrier for charge carriers which is established in the current path near a controlling electrode and being controllable by a controlling voltage and a drain voltage.

Thus, the static induction transistor may be said to resemble the bipolar transistor in the aspect that a potential barrier exists in the current path. As is well known, a bipolar transistor consists of an emitter, a base and a collector region. The conductivity type of the base region is opposite to that of the emitter and collector regions. Thus, there are npn-type and pnp-type bipolar transistors. FIGS. 1A, 1B and 1C diagrammatically illustrate a conventional npn bipolar transistor. In FIG. 1A, a bipolar transistor comprises an n type emitter region 1, a p type base region 2 and an n type collector region 3. Potential profiles of the bottom of the conduction band along lines 1B—1B' and 1C—1C' are shown in FIGS. 1B and 1C. It will be apparent that the top of the valence band (not shown) is parallel to but lower than the bottom of the conduction band approximately by the forbidden gap energy of the semiconductor material. The energy of a hole is positive in the downward direction. When no voltage is applied to the base and the collector, the bottoms of the conduction band in the n type emitter and collector regions are at similar energies (e.g. $\phi_1$). Since the base region 2 is of p type, the Fermi energy in the base region 2 is near the top of the valence band, and hence the bottom of the conduction band is raised to a level $\phi_2$ by the built-in potential. Thus, the base region 2 forms a barrier for the electrons transferred from the emitter 1 to the collector 3. When a positive collector voltage is applied, the bottom of the conduction band in the collector region is lowered to a corresponding energy as shown by $\phi_3$ in the Figures. In such a state, however, no carrier is allowed to flow from the emitter 1 to the collector 3 since there remains a barrier of a height ($\phi_2 - \phi_1$) at the emitter-base junction for the electrons in the emitter region 1. When a positive base bias voltage is applied, the bottom of the conduction band in the base region 2 is lowered from the level $\phi_2$ by the applied voltage. As the bottom of the conduction band in the base region 2 approaches the bottom of the conduction band in the emitter region 1, carriers (electrons in this case) begin to proceed over the reduced (or vanished) barrier, and they penetrate through the base region 2. Thus, a collector current is formed. Here, it should be noted, however, that since the base region has its own charge carriers (holes in this case) of the opposite conductivity type, they also begin to proceed over the barrier toward the emitter region. Thus, a base current is allowed to flow. Here, it should be noted that the base potential is controlled by the base bias voltage through the base resistance, so that the base potential is basically uniform in the cross-sectional direction when the base current is small. In case the base current becomes large accompanying the significant voltage drop across the base resistance, the base potential tends to shift from the uniform profile and exhibits highest value at the center of the base region in the symmetrical structure. The position of the highest potential barrier shifts from the center in the unsymmetric structure.

A fundamental structure of an n-channel static induction transistor according to an embodiment of the present invention is illustrated in FIG. 2A, and the potential profile of the bottom of the conduction band along the line 2B—2B' is illustrated in FIG. 2B for the two operational modes. The zero level in FIG. 2B indicates the bottom of the conduction band in a neutral n type region.

FIG. 2A shows a planar-type structure in which an n⁻ type region 12 is epitaxially grown on an n⁺ type substrate 13 serving as a drain, and an n⁺ type region 11 is diffused or implanted in the surface of the n⁻ type region 12 to form a source region. A p⁺ type gate region 14 is formed in the surface of the n⁻ type region 12 by either the ion implantation, the diffusion, or the etching and deposition technique to substantially surround the source region 11 and to define a current channel region. The impurity concentration of the current channel region of the n⁻ type region 12 and the gate-to-gate distance (i.e. the width of the current channel region) W are so selected as to excessively pinch off the current channel region with the depletion layers at zero gate bias as shown in the left-hand diagram of FIG. 2B. Namely, the bottom of the conduction band is raised by $\Delta\phi$ at the center of the channel. In this state, the drain current is controlled mainly by the height of the barrier since the height of the barrier contributes inversely exponentially to the amount of the drain current. When a positive gate bias is applied, the bottom of the conduction band in the p⁺ type gate region 14 is lowered and approaches the bottom of the conduction band in the channel portion, and hence the depletion layer shrinks to reduce the barrier height. Above a certain positive gate bias, a neutral region of a width w appears in the current channel region as shown in the right-hand diagram of FIG. 2B. Then, the barrier vanishes, and the drain current is then controlled mainly by the width w of the neutral channel region. In this operation mode, the static induction transistor (SIT) is basically analogous to the conventional field effect transistor in the aspect that the drain current is controlled mainly by the width (i.e. resistance) of the neutral current channel. But electrons in the highly doped source region are directly injected into the channel region in SIT and the injected carriers density easily became higher than the impurity concentration. Carrier injection from the source region is enhanced by the hole injection to the channel from the gate region.

When the current channel portion is not pinched off at zero gate bias, such characteristic curves as shown in FIG. 3 appears as disclosed in U.S. patent application Ser. Nos. 817,052 and 576,541. Under the application of a reverse gate bias, the width of the neutral channel region vanishes. When a neutral channel remains, the drain current vs. drain voltage characteristics are substantially linear, following the Ohm's law, as shown by the group A of the curves. In this operation range, the transistor may be considered as a variable resistor. After the neutral channel region has vanished, a barrier is established at the depleted pinch-off portion. Then, a drain current will not flow until a certain threshold drain voltage is applied. When the drain voltage $V_{DS}$ exceeds the threshold value, the drain current $I_{DS}$ will increase exponentially in the small current region with an increase in the drain voltage $V_{DS}$ as shown by the group B of the curves.

When the current channel is deeply pinched off by the depletion layers at zero gate bias as in the present embodiment, the drain current will not grow very large under a forward gate bias below a certain value, since a certain forward gate bias is required to reduce the height of the potential barrier. In the SIT of the present invention, the potential profile in the cross-sectional direction is not uniform and is lowest at the center of the channel in the symmetric structure as shown in FIG. 2B. This situation originates from the fact that the channel potential is capacitively controlled by the gate bias voltage. When the structure becomes unsymmetric, the potential minimum point in the cross-sectional direction shifts from the channel center.

Figure 4:
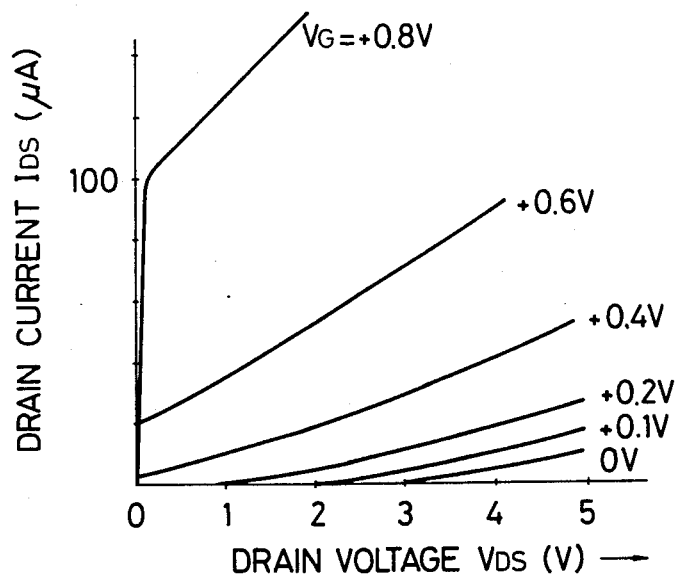

When the $n^-$ region 12 is formed of silicon so as to have an impurity concentration of about $n=1\times10^{13}$ cm$^{-3}$ and a thickness of about 3 $\mu$m (micrometers), and when the $p^+$ gate region 14 is formed by the diffusion technique so as to have a surface impurity concentration of about $p=1\times10^{19}$ cm$^{-3}$ and a depth of about 3 $\mu$m and to define a square channel having a cross-section of about $5\times5$ $\mu$m$^2$, characteristics shown in FIG. 4 are obtained.

It is to be noted that the drain current rapidly grows large and shows a kink at low drain voltages such as 0.1 V or less than that for the characteristic curves of $V_G=0.4$, 0.6 and 0.8 V. It can be considered that, at these gate biases, there appears a neutral channel region. Furthermore, with an increase in the forward gate voltage, the top of the valence band in the $p^+$ type gate region is lowered (potential is increased for holes), and will approach and may eventually reach the level of the top of the valence in the channel region 12. Then, free holes in the $p^+$ type gate region may be injected into the $n^-$ type channel region. Such positive charge in the $n^-$ type channel region 12 will exhibit an attractive force to attract the electrons, although these electrons are less in number than that of the majority carriers injected from the source region in the channel, and may help inducing injection of electrons from the $n^+$ type source region 11. Both types of carriers are basically drifted by the electric field in contrast to the conventional bipolar transistor. The change in the main (drain) current $I_D$ with respect to the change in the gate current $I_G$, $\Delta I_D/\Delta I_G$, which corresponds to the current amplification factor $\beta$ of the conventional bipolar transistor, is very large according to the present invention, because the channel potential is capacitively controlled by the gate bias voltage in the basic operation. At higher drain currents, the IR voltage drop across the series resistance from the source electrode to the intrinsic gate will become large to act as a negative feedback factor. Here, it should be noted, however, that a small barrier between the source region (e.g. $n^+$ type) and the channel region (e.g. $n^-$ type) ascribed to the difference of the Fermi level in these regions will still remain.

It is seen from the Figure that this device is suitable for the switching operations. For example, the device is rendered "off" at a gate bias voltage of about 0 to 0.2 V (volts), and is rendered "on" at a gate bias voltage of about 0.6 V or larger than 0.6$^-$ V.

According to the measured data, the power dissipation of a logic gate according to an embodiment of the present invention is of the order of 0.01 mW.

In semiconductor integrated circuits, it is often preferable to dispose the drain regions on the upper surface because of the easiness of wiring and circuit designing. Furthermore, it should be noted that, when the drain voltage is subjected to changes, the capacitance accompanying the drain region is smaller the better. Thus, an upside-down structure is of interest. Namely, in the structure of FIG. 2A, the $n^+$ type region 11 may be used as a drain, and the $n^+$ type region 13 as a source. In such upside-down structure, however, the source-to-gate distance naturally changes to the distance between the $n^+$ type region 13 and the $p^+$ type region 14. In order to reduce the source-to-intrinsic gate series resistance, the thickness of the $n^-$ type region below the bottom of the $p^+$ type gate region may be reduced (or vanished in some cases). Furthermore, the lower edge of the gate region 14 is preferably more sharpened by relying on the selective etching and deposition techniques. The above will hold true also in the following embodiments. Furthermore, it will be apparent that p-channel devices can be formed by reversing all the conductivity types of the semiconductor regions. Naturally, the use of the characteristics of FIG. 4 is arbitrary, and never is limited to the above example. Also, it will be apparent that the characteristics as shown in FIG. 4 can be varied widely by the selection of the device parameters.

As an example, the device parameters of the silicon transistor structure of FIG. 2A are changed in such a manner that the $n^-$ type channel region 12 has an impurity concentration of $1\times10^{13}$ cm$^{-3}$, a circular cross section of 10 $\mu$m$\phi$ (micrometer diameter) and a thickness of 10 $\mu$m and that the gate region 14 has an impurity concentration of $1\times10^{19}$ cm$^{-3}$, a width of 15 $\mu$m and a depth of 2.5 $\mu$m. Then, under the conditions: a gate bias voltage $V_G=0$ V and a drain voltage of $V_D=5$ V, the drain current is noted to be about 5 $\mu$A and the current amplification factor $\beta$ exceeds one hundred when the region 11 is used as the source. When the region 13 is used as the source (upside-down structure), the drain current is noted to be below 3 $\mu$A, and the current amplification factor $\beta$ is about 10.

FIGS. 5 to 8 show typical examples of the cross-sectional structure of the semiconductor device according to embodiments of the present invention.

Figure 5:
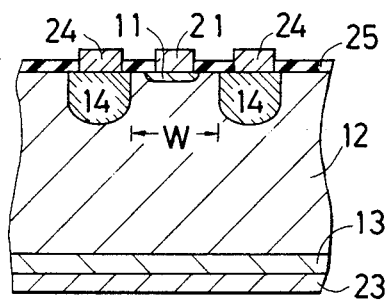
FIGS. 5 to 8 are diagrammatic cross-sections showing structures of the semiconductor device according to embodiments of the present invention.

FIG. 5 shows a planar structure of surface gate type similar to that of FIG. 2A. In this embodiment, the $n^-$ type region 12 is formed thick on the side of the $n^+$ type drain region 13 to arrange so that the maximum drain voltage to be large. The $p^+$ type gate region 14 defines a current channel in the $n^-$ type current channel region 12.

Figure 6:
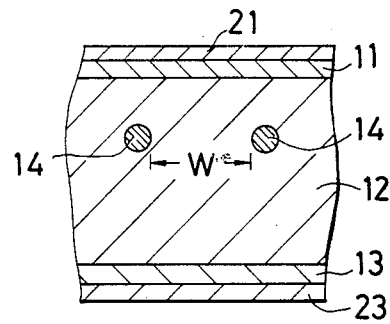
Figure 7:
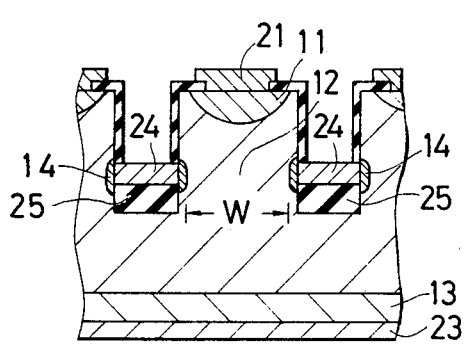

In FIG. 6, the $p^+$ type gate region 14 is embedded in the $n^-$ type channel region 12. This structure is suitable for making a transistor of a short channel length. By arranging the embedded $p^+$ type gate region so as to define a multiplicity of channels, a large output transistor may be formed. The $p^+$ type gate region 14 is extracted on the surface by a mesa-like structure or by a $p^+$ type extracting region extending to the surface. In FIG. 7, $p^+$ type gate regions are formed in the recessed portions. Namely, cut-away grooves are formed around the $n^+$ type source region 11 and the gate regions 14 are formed in the side wall portion of the cut-aways. The bottom portions of the cut-aways are covered with a thick insulator (e.g. oxide) layer, and gate electrodes 24 are formed thereon. The $p^+$ type gate region 14 touches the gate electrode 24 on the side surface. This structure is suitable for minimizing the gate capacitance and increasing the current gain, although the manufacture thereof is not simple. The space above the gate electrode 24 is filled with an insulating material such as polyimid resin, silicon oxide, polycrystalline silicon of high resistivity, and so forth.

Figure 8:
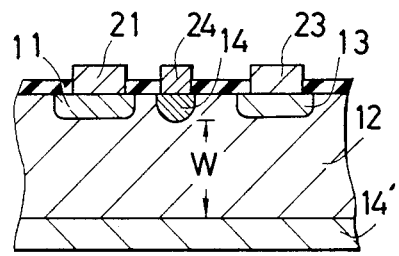

FIG. 8 shows a lateral structure in which the current channel region is defined by the p+ type upper gate region 14 and the p+ type lower gate region 14'. The lower gate region 14' may be electrically connected to the upper source region 11 or set at a constant voltage. This structure is easy to manufacture although the surface occupation area will become large. In these embodiments, the channel width and the impurity concentration in the channel are chosen so as that there appears a potential barrier in the channel due to the gate to channel built-in voltage. The drain current is allowed to flow by applying a gate bias voltage in a forward direction.

It will be apparent that p-channel devices may be formed simply by reversing all the conductivity types. Also, the source and the drain regions may be exchanged to form upside-down (or inversely operated) structures as mentioned before. In any of the above-mentioned structures, the current channel region is so designed that it becomes completely pinched off at zero gate bias voltage. Alternative structures may be found in the co-pending U.S. patent applications mentioned before.

What are most important in the present invention are the channel width W and the impurity concentration in the region of high resistivity especially that in the channel region in which the channel is formed and the main current is controlled. The term "just pinched-off" will be used to express the state that the channel is just pinched off by the depletion layers, i.e. the depletion layers growing from both sides of the channel just touch each other. Similarly, the term "over pinch-off" will be used to express the state that the depletion layers growing from both sides of the channel overlap each other, and that a potential barrier is established for all the charge carriers moving from the source to the drain.

According to the present invention, the channel is over pinched off at zero gate bias through the selection of the channel width W and the impurity concentration in the channel region. For example, in the case of silicon device, it should be understood that, when the impurity concentration in the channel region is $1 \times 10^{14}$ cm$^{-3}$, $1 \times 10^{13}$ cm$^{-3}$ and $1 \times 10^{12}$ cm$^{-3}$, the channel width is preferably not wider than about 6 $\mu$m, about 20 $\mu$m and about 60 $\mu$m, respectively. More preferably, the channel width W is so selected that the depletion layer (of width $d_0$) from each side touches the other side of the channel (W≈$d_0$) at zero bias. Then, the potential barrier will have a height (at the central portion) above about one quarter of the built-in potential. In this case, the main current of the static induction transistor (SIT) in its "off" state is reduced less than at least one tenth of that of the just pinched-off static induction transistor. When the channel width is so selected that the depletion layer from each side would extend twice the width of the channel region (W≈$\frac{1}{2}d_0$), the potential barrier will have a height above about 90% of the built-in potential. The off-state current becomes extremely small.

When the channel width is excessively narrowed, the resistance of the channel in the "on" state will become large. Therefore, there is a limit in narrowing the channel. From the viewpoint of low "on" resistance, meaning a low channel resistance when the transistor is turned "on", the channel preferably has a large width. Thus, the impurity concentration in the channel region is preferably as low as possible provided that the manufacture thereof can be done stably and preferably at a low cost.

The gate region, on the other hand, preferably has a high impurity concentration from the viewpoint of low gate spreading-resistance. A higher impurity concentration of the gate region will accompany a higher built-in potential between the gate and the channel. Furthermore, the gate region preferably has a thin width for decreasing the parasitic gate capacitance and the gate current. A decrease in the gate capacitance will lead to an improvement in high speed operation. Furthermore, when the gate voltage is sufficiently high in the forward direction, there is the possibility that a current flows between the source and the gate. Considering this fact, the channel region preferably has a larger cross section in comparison with the area of the gate region exposed to the source region. In the static induction transistor, however, there is a potential barrier established along the gate junction due to the built-in potential of the gate junction, and charge carriers from the source region are condensed in the channel region. Thus, this limitation of the area of gate region with respect to that of the channel is not so severe as in the bipolar transistor. Yet, some consideration should be paid on this aspect, particularly in the upside-down structure. In an experiment, the current amplification factor $\beta$ exceeds unity when the gate area is one hundred times broader than that of the channel region in an upside-down structure. This ratio can be used as an estimate for the critical value.

Under the forward gate bias, the minority carriers injected from the gate region, if any, are diffused to reach the source region. The possibility of recombination in the channel region of a low impurity concentration is very small. When the built-in potential of the gate to channel junction is desired to be lower on the drain side as compared to that on the source side, the impurity concentration in the gate region and/or that in the channel region may be graded.

Figure 9A:
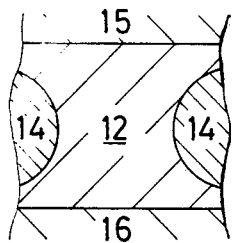
FIGS. 9A, 9B and 9C are diagrams showing alternative channel structures of the semiconductor device shown in FIGS. 5 to 8 according to embodiments of the present invention.
Figure 9B:
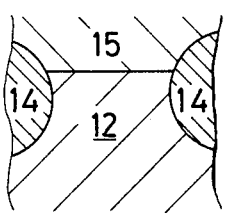
Figure 9C:
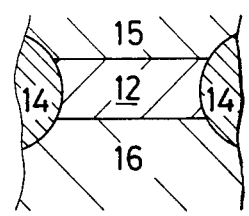

FIGS. 9A to 9C show embodiments of the channel structure following the embedded gate structure of FIG. 6. In FIG. 9A, then n$^-$ type region 12 covers most of the surfaces of the p+ type gate region. Because of the presence of the high resistivity regions, both the junction capacitance between the source and the gate and the capacitance between the gate and the drain are small. In FIG. 9B, the n$^-$ type region 12 of a high resistivity is formed to an intermediate height of the p+ type gate region 14, and another region 15 of a relatively low resistivity is grown thereon. Thus, the source-to-intrinsic gate resistance becomes small, the maximum drain voltage may be high and the gate-to-drain capacitance can be reduced. The region 15 of the lower resistivity may be formed so as not to touch the gate region, but to be separated therefrom by a thin n$^-$ type region of a high resistivity. In other words, the n+ type source region may be projected into the channel between the gate regions to lower the series resistance. Similar arrangement may be adopted also on the drain side. FIG. 9C shows another structure in which the current channel region 12 of a high resistivity is formed only in a limited thin region surrounded by the gate regions 14. Regions 15 and 16 sandwiching the channel region 12 and the gate region 14 therebetween may have the same resistivity or different resistivities. By suppressing the thickness of the channel region, the whole source-to-drain "on" resistance (meaning when such resistance when the transistor is turned on) can be made very small while the leak current when the transistor is turned off can be arranged to be very small. In these structures, the impurity concentration in each region may be arranged to have a gradient. In an extreme case, there may be no boundary of regions. Also, the selection of the impurity concentration may be changed widely to meet the aimed use. The channel region of a low impurity concentration may also be formed with an intrinsic region. In these embodiments, the channel width and the impurity concentration in the channel are chosen so as to establish the potential barrier in the channel at zero gate bias voltage.

Figure 10A:
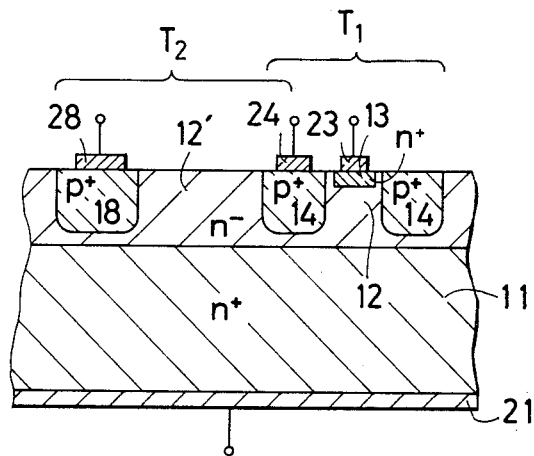
FIGS. 10A and 10B are a diagrammatic cross-section and a circuit diagram of an integrated injection logic (IIL) circuit according to another embodiment of the present invention.
Figure 10B:
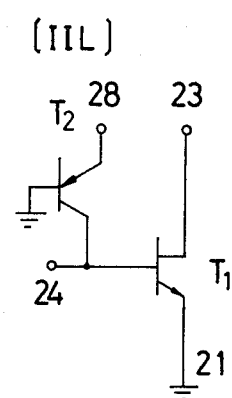

FIGS. 10A and 10B shown an SIT IIL structure and a circuit diagram thereof, respectively. In FIG. 10B, a bipolar injector transistor $T_2$ serves as a constant current source and supplies a current to an input terminal 24 (when it is at low voltage) or to the gate of a static induction transistor $T_1$. Namely, when the driver transistor of the preceding stage is turned off, the carriers are injected to the gate of the static induction transistor $T_1$ and raise the gate potential. Then, the driver transistor $T_1$ of this stage is turned on and the output terminal is connected to a low voltage. Thus, an output terminal 23 provides an inverted output. In FIG. 10A, the injector (or load) transistor $T_2$ is formed with a lateral bipolar transistor including a p+ type emitter region 18, an n− type base region 12' and a p+ type collector region 14, and the driver (or inverter) transistor $T_1$ is formed with an upside-down static induction transistor including an n+ type source region 11, an n− type channel region 12, an n+ type drain region 13 and a p+ type gate region 14. The gate region 14 which is a region common with the collector region of the bipolar transistor $T_2$ surrounds the channel region 12 to define the current channel region. Also, the gate region 14 is formed deep into the n− type region 12 so as to reduce the source-gate distance since this static induction transistor is the upside-down type. Electrodes 28, 24, 21 and 23 are formed on the regions 18, 14, 11 and 13, respectively. When a positive signal voltage is applied to the input terminal 24, the carriers (holes) are directed to the collector region 14 and stored therein. Then, the gate potential rises to turn the n-channel static induction transistor $T_1$ on. Here, it should be noted that, as the gate potential rises, holes may be injected from the p+ type gate region into the n− type channel region. The positive charge in the channel region 12 helps inducing the injection of electrons from the source region 11. Thus, the channel resistance is reduced to provide a large drain current with a small supply voltage. Furthermore, since a forwardly biased static induction transistor allows the pressure of a gate current, the static induction transistor $T_1$ may work as a current sink to reduce the change in amount of the carrier injected through the injector transistor $T_2$. Thus, this SIT IIL structure provides a high speed operation together with a small gate capacitance.

It can be easily seen that a large fan-out may be provided by increasing the number of drain regions, each being surrounded by a common gate region. Since the injector transistor mostly serves as a constant current source, it may be formed with any type of transistor, i.e. bipolar transistor, junction field effect transistor, insulated-gate field effect transistor or a static induction transistor.

The static induction transistor (SIT) according to the present invention can perform a high speed operation at a low power dissipation, using a forward gate bias, and can substitute even a part of a conventional bipolar transistor circuit.

Now, further embodiments of the static induction transistor integrated circuits (SIT-IC) which can be substituted for bipolar IC's will be described. It will be apparent that the conductivity types of the respective semiconductor elements can be reversed by reversing the polarity of supply voltages. Furthermore, part of the SIT's shown in the figures may be replaced with bipolar transistors.

Figure 11:
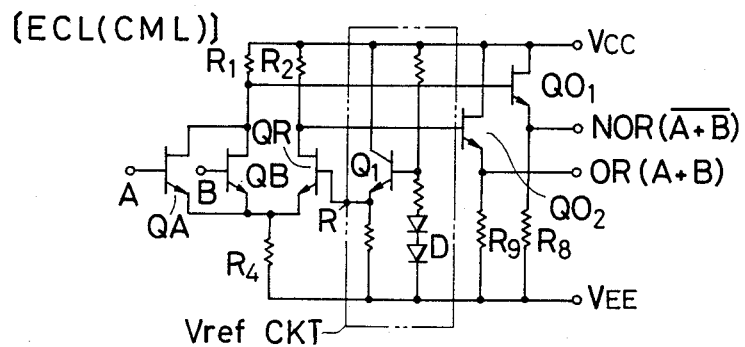
FIGS. 11, 12 and 13A are circuit diagrams of emitter-coupled logic (ECL) or current mode logic (CML) circuits according to further embodiments of the present invention.

FIG. 11 shows an emitter-coupled logic (ECL) or current mode logic (CML). In the circuit, input signals are applied to the gates of the input SIT's QA and QB which are connected with a drain resistor $R_1$ and a source resistor $R_4$. A reference SIT QR is connected to a drain resistor $R_2$ and the common source resistor $R_4$. When an input signal A and/or B is applied, the input SIT QA and/or QB is turned "on", and the common drain voltage will decrease (NOR logic). Also, the IR voltage drop across the resistor $R_4$ will increase to turn the reference SIT QR off to raise the drain voltage thereof (OR logic). These NOR and OR logic signals are amplified (impedance transformation) in the output SIT's $QO_1$ and $QO_2$ to provide low impedance outputs. The reference SIT QR is supplied with a constant reference voltage supplied from a reference voltage circuit $V_{ref}$ CKT in which a bipolar transistor is connected with a resistor to generate a constant voltage at point R. Diodes D are used for the temperature compensation. Similar reference voltage circuits are used also in the following embodiments. The SIT of the present invention is obviously used in the reference voltage circuit.

In high speed semiconductor IC's, the operation speed is influenced by the accompanying capacitance which is being subjected to charging and discharging. In the circuit of FIG. 11, all the drain, gate and source regions of the input and reference SIT's QA, QB and QR are subjected to voltage change. Thus, the operation speed is limited. In order to enhance the operation speed, the number of regions which are subjected to voltage changes as well as the area of such regions are preferably reduced.

Figure 12:
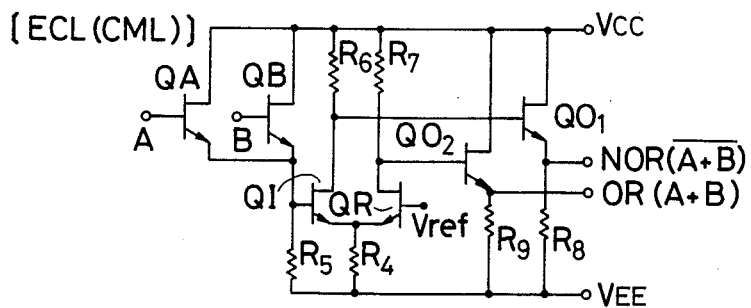
Figure 13A:
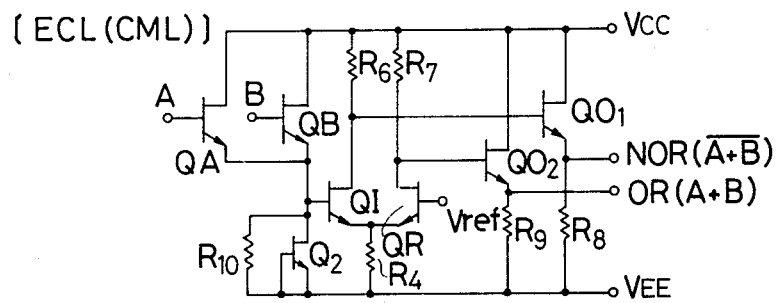
Figure 13B:
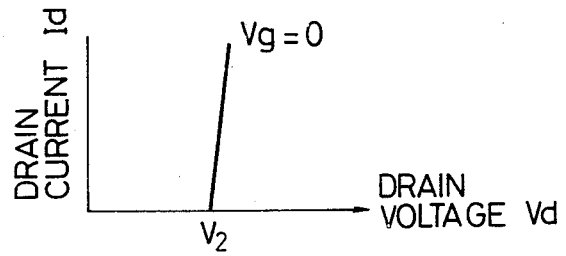
FIG. 13B is a diagrammatic diagram showing an I-V characteristic curve of the constant voltage transistor $Q_2$ employed in the circuit of FIG. 13A.

FIG. 12 shows a modification in which the drains of the input SIT's QA and QB are directly connected to the constant supply voltage $V_{cc}$, and an intermediate SIT QI is used. Namely, the input SIT's QA and QB generate an OR signal at their sources, and the intermediate SIT QI inverts this OR signal into a NOR signal. The output SIT's $QO_1$ and $QO_2$ perform impedance transformation. In this circuit, a resistor $R_5$ is used as a load for the input SIT's. When stability in the voltage level at the input of the intermediate SIT QI is desired, the load resistor $R_5$ may be replaced by a parallel connection of a resistor $R_{10}$ and an SIT $Q_2$, which provides a constant voltage characteristic of FIG. 13B, as shown in FIG. 13A.

Furthermore, if the current instability becomes a problem, a current limiting field effect transistor may be connected in series to the input SIT's.

Figure 14A:
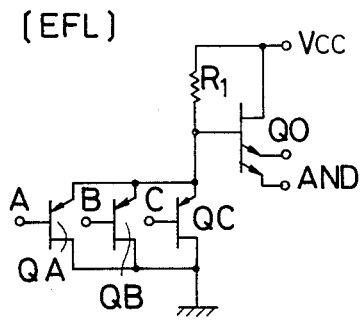
FIGS. 14A and 14B are circuit diagrams showing examples of emitter-follower logic (EFL) circuits of AND gate according to embodiments of the present invention.
Figure 14B:
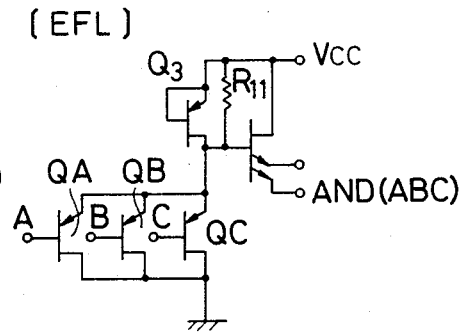
Figure 15A:
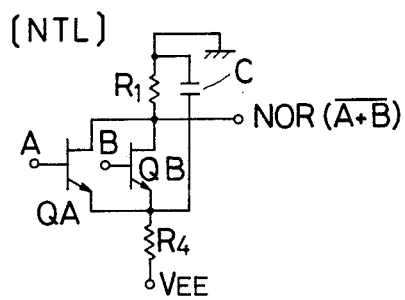
FIGS. 15A and 15B are circuit diagrams showing non-threshold logic (NTL) circuits of NOR gate according to embodiments of the present invention.
Figure 15B:
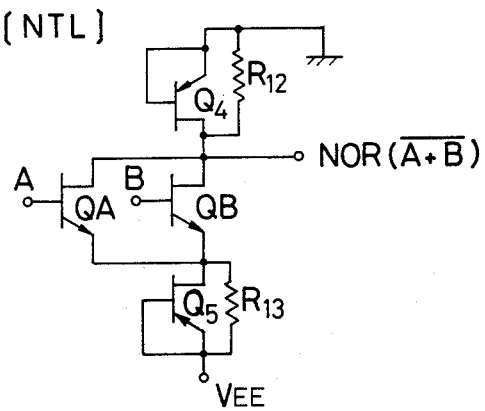

FIGS. 14A and 14B show emitter-follower logic (EFL) circuits of a 3-input AND gate. Three p-channel input SIT's are connected in parallel and an n-channel multi-drain SIT is connected in a source-follower arrangement. The load for the input SIT's may be a resistor $R_1$ (FIG. 14A), or a parallel connection of a constant voltage SIT $Q_3$ and a resistor $R_{11}$ (FIG. 14B). In the FEL circuit, input SIT's QA, QB and QC are normally "on", so that the source voltage becomes high only when all the inputs A, B and C are at a high level and all the input SIT's QA, QB and QC are cut off. The source follower SIT QO provides an amplified AND output. The replacement of a load resistor by a parallel connection of a constant voltage type SIT and a resistor is effective when the fan-out is large and when the voltage variation due to dispersion of the respective input transistors is not negligible. FIG. 15A shows an non-threshold logic (NTL) circuit, wherein input SIT's QA and QB are connected in parallel to each other and in series to a load resistor $R_1$. A capacitor C short-circuits the ac component at the source of the input SIT's to the ground. FIG. 15B shows a modification of non-threshold logic circuit, wherein the load resistor $R_1$ in FIG. 15A is replaced by a parallel connection of a constant voltage type SIT $Q_4$ and a resistor $R_{12}$. Furthermore, a resistor $R_4$ in FIG. 15A is replaced by a parallel connection of a constant voltage type SIT $Q_5$ and a resistor $R_{13}$. In FIGS. 15A and 15B, the NOR signal is provided at the common drain region of the input SIT's QA and QB, respectively.

Figure 16:
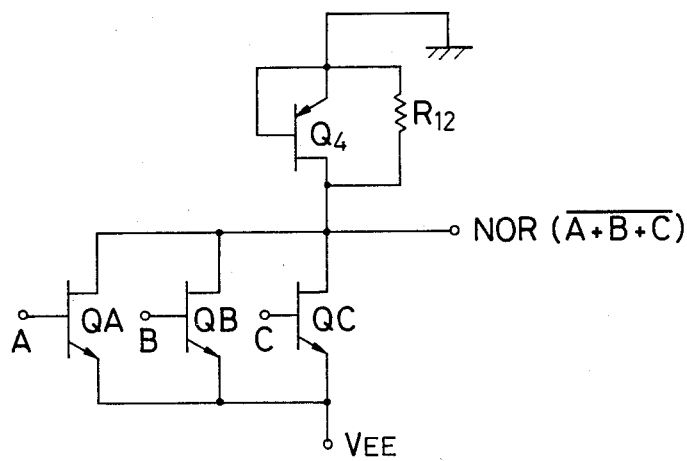
FIG. 16 is a circuit diagram showing a direct-coupled transistor logic circuit of NOR gate according to an embodiment of the present invention.
Figure 17:
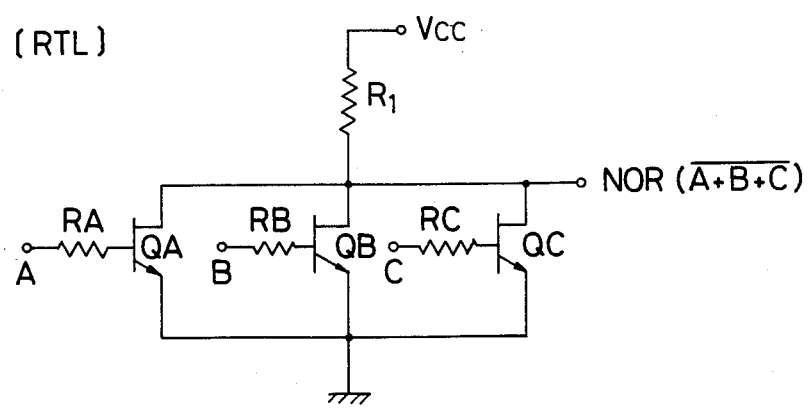
FIGS. 17, 18 and 19 are circuit diagrams showing a resistor transistor logic (RTL) circuit, a diode transistor logic (DTL) circuit and a transistor-transistor logic (TTL) circuit according to embodiments of the present invention.

FIG. 16 shows a 3-input NOR logic circuit wherein three input SIT's QA, QB and QC are connected in parallel to each other and in series to the parallel connection of a constant voltage type SIT $Q_4$ and a resistor $R_{12}$. FIG. 17 shows a 3-input resistor transistor logic (RTL) circuit forming a NOR gate, wherein three input signals A, B and C are applied to input SIT's QA, QB and QC through resistors RA, RB and RC, respectively. The RTL circuit has the disadvantage that the operation speed is reduced by the input resistors.

Figure 18:
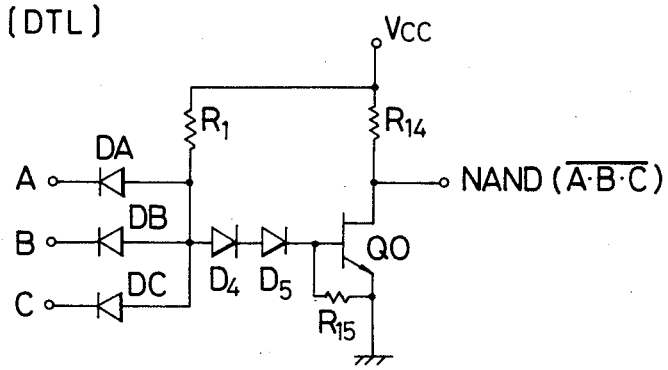

FIG. 18 shows a diode transistor logic (DTL) circuit, wherein three inputs A, B and C are applied through normally "on" diodes DA, DB and DC to supply an AND signal at their common anode. An SIT QD is used to invert the AND signal and to supply an amplified NAND signal.

Figure 19:
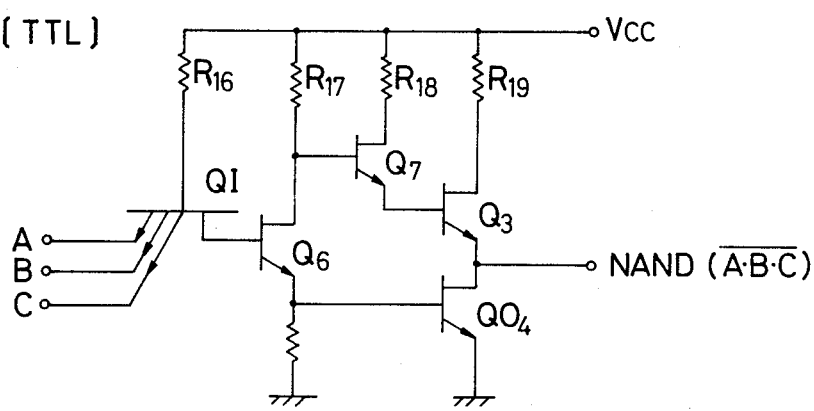

FIG. 19 shows a transistor-transistor logic (TTL) circuit, wherein three inputs are given to a normally "on" 3-fan-in SIT QI to provide an AND signal at the common source. The AND signal is inverted and amplified through SIT's $Q_1$ to $Q_4$ to supply a NAND signal.

As has been described above, the static induction transistor having a current channel which is over pinched-off at zero gate bias provides a high speed operation, and can substitute a bipolar transistor without requiring a drastic change of the circuit design. Furthermore, such substitution can be done only in part of a total system.

In a punch-through bipolar transistor, the base region is almost or completely pinched off (depleted) so that carriers can punch through the base region. The presence of the punch-through bipolar transistor has been known, but no detailed research has been made heretofore.

Referring back to FIGS. 1A to 1C, when the base region 2 is formed with, for example, a thin p type region of a low impurity concentration, depletion layers will grow from the junctions which are formed with n+ type emitter and collector regions 1 and 3 to reduce the effective base region of the flat potential portion. Where the potential profile of the band extrema shows gradient, free charge carriers will flow out to the lower energy portion to leave no free charge carriers, and only the ionized impurity atoms remain. When there remains almost no flat band portion (i.e. neutral region) in the base region, the base region is pinched off, and will serve as a potential barrier for those electrons moving from the emitter region. Such a depleted base region tends to loose the character of resistive control. In such depleted state, the height of the potential barrier can be controlled fundamentally capacitively by the base and collector voltages. In the punch-through bipolar transistor, there exists the built-in voltage between the p+ region and the p region, so that the potential profile in the cross-sectional direction of the base region shifts from the uniform profile and exhibits minimum valve at the center of the channel in the symmetric structure. When the structure is not symmetric, the potential minimum point shifts from the center of the channel. Thus, the collector current will increase with an increase in the collector voltage. The punch-through bipolar transistor resembles the static induction transistor described in this specification in this aspect of the presence of a capacitively controllable barrier height at zero base and drain voltages. In the punch-through bipolar transistor, the barrier height can, in most cases, be above about one half of the forbidden gap at zero base and collector voltages to provide wider dynamic range than that of the static induction transistor, but the ionized impurity atoms in the base region have the same polarity as that of the carriers to be injected from the emitter region. Thus, the punch-through bipolar transistor may provide a performance which is somewhat inferior to that of the static induction transistor, but it can be used as a good substitute of the static induction transistor. Since the base region is substantially pinched off (depleted), the charge carriers are drifted by the electric field which is established therein, and the storage of minority carrier is very small, to provide a good high frequency performance and a high speed operation. Furthermore, since the gate capacitance is very small due to the substantially pinched-off and thin base region, the power dissipation is reduced further and the operation speed is enhanced. In the punch-through bipolar transistor, there exists substantially or completely depleted base region having an opposite conductivity type compared to the emitter and the collector region, so that there easily appears a high potential barrier in the channel compared to that in the channel of the SIT of the present invention described previously. Thus, the channel length, i.e., the emitter to collector distance, can be reduced compared to the SIT described previously where the potential barrier height holds at the same value. These advantages are exhibited most apparently when the punch-through transistors are used in integrated circuits.

Embodiments of integrated circuit structures including the punch-through bipolar type transistor as described above will be described hereinbelow.

Figure 20:
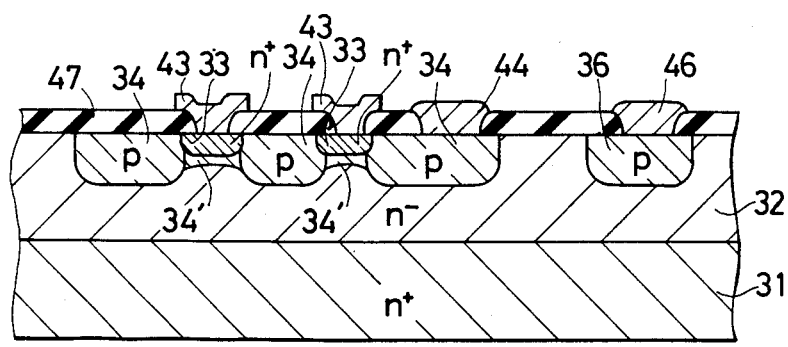
FIGS. 20 and 21 are diagrammatic cross-sections of structures of integrated injection logic (IIL) circuits according to further embodiments of the present invention.
Figure 21:
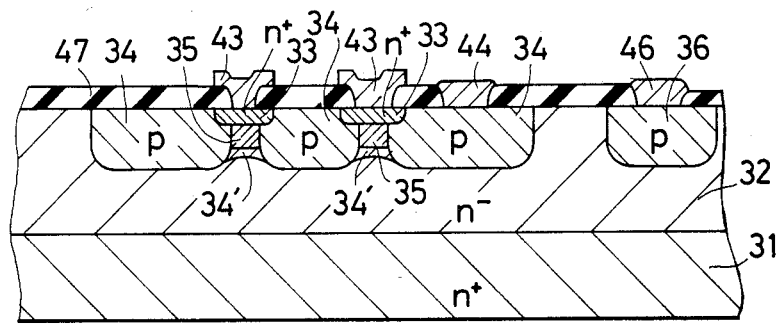

FIGS. 20 and 21 show IIL circuit structures including the punch-through bipolar transistor according to embodiments of the present invention. Namely, in the structure of a vertical type upside-down static induction transistors, a thin p type region interrupts an n type channel adjacent to a drain region (FIG. 20) and in the midway of this channel (FIG. 21).

Referring to these Figures, an n− type region 32 is formed on an n+ type region 31. A lateral bipolar transistor is formed by the n− type region 32 and the p type regions 34 and 36. The p type region 36 serves as an emitter of the injector transistor, and the p+ type region 34 serves both as a collector of the injector transistor and as the gate region of the originally intended driver SIT. A thin p type layer 34' connects the p+ type regions 34, and separates the n type current path into the source (emitter) part and the drain (collector) part.

When a region of an opposite conductivity type is present in the current path of a unipolar transistor, the transistor should no longer be called a unipolar transistor but be considered to be called a bipolar transistor. But the operational principle is very similar to the device described previously. This bipolar transistor of the upside-down type is formed with an n+ type emitter region 31, an n− type region 32, a thin p type base region 34' and an n+ type collector region 33 with or without intervening an n− type region 35 between the p type region 34' and the n+ type collector region 33. The thick p+ type region 34 which is contiguous to the thin p type region 34' will be referred to as a gate region. Electrodes 46, 44 and 43 are formed on the regions 36, 34 and 33 to serve as the emitter and collector electrodes of the injector transistor and as the collector electrode of the driver transistor, respectively. An insulating film 47 covers the other surfaces than the metal contact area. The base region 34' is thin and has a low impurity concentration, so that it is substantially depleted with the depletion layers which grow by the built-in potential alone which exists between the emitter and the base regions and between the base and the collector regions. In these embodiments, p type regions 34' may be formed by redistributing p type impurities from the p+ type region 34. Then, the impurity concentration and the thickness of the p type region 34' will decrease as it goes toward the center. The height of the potential barrier formed at the p type regions 34' is the smallest at the central portion due to the fundamental character of capacitive control and possibly to a graded impurity concentration as described above. In this respect, similar performance to that of the static induction transistor is expected in the punch-through bipolar transistors of these embodiments, and practically is found to exist. It is proved that the punch-through bipolar transistor may be positively manufactured as a substitute of the static induction transistor.

If the base region has an excessively small thickness and an excessively low impurity concentration, the energy positions of the band extrema in the base region become almost the same as those of the emitter and the collector regions. In such case, no potential barrier is present practically, and the transistor will loose the controlling ability of the main current which is to be controlled by a controlling voltage.

Therefore, the "substantially pinched-off base region" is herein defined as a base region mostly depleted but having Fermi level different from that of the emitter region, so that the base region establishes a potential barrier for the charge carriers flowing from the emitter to the collector, and that the height of the potential barrier is fundamentally capacitively controllable by the gate and the collector voltages. Namely, the effective base region (neutral base region) is extremely thin and has a very small parasitic capacitance. Therefore, the carrier storage effect is a small particularly narrow p region structure, and a very high operation speed is provided. Carriers flowing from the emitter to the collector pass over the potential barrier formed by the depleted base region, and are injected to the collector side and are drifted by an electric field established by the collector voltage. There appears almost no effect of storage of minority carriers. Apparently, when the base bias is set to be sufficiently forward, minority carriers can be injected from the gate region 34 to the emitter region 33 through the base region 34'. In such a case, the base region 34' will possess the property of a usual base region of the bipolar transistor. The gate region 34 may be formed thick and it may be heavily doped, so that the resistance of the region 34 is negligible.

It will be apparent that, throughout these as well as the following embodiments, various modifications and alterations are possible within the scope of the present invention.

Figure 22:
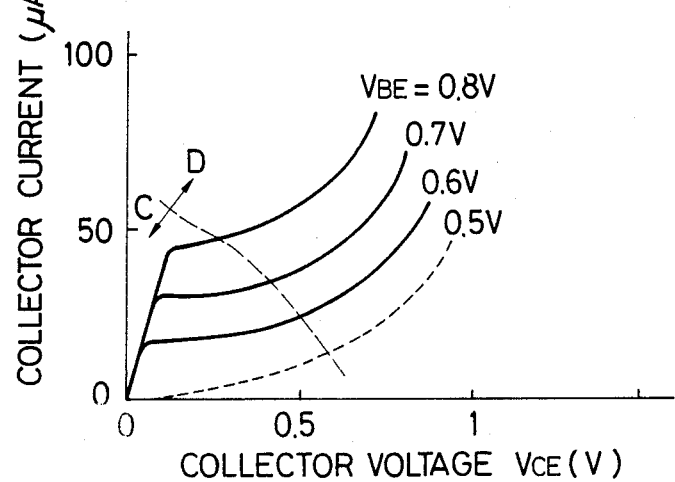
FIG. 22 is a diagram showing I-V characteristic curves of a semiconductor device employed in the circuit of FIGS. 20 and 21.

A measured example of the current versus voltage characteristics of a punch-through bipolar transistor which can be used in the embodiments of the present invention is shown in FIG. 22. It is considered that the base region is not yet completely depleted only by the built-in potential, since the region C shows bipolar-like characteristics. However, as the base bias voltage and/or the drain voltage become more forward, the drain current will increase to exhibit non-saturating characteristics as shown in the region D, indicating that the base region becomes depleted and the barrier height is gradually pulled down by an increase in the drain voltage. A decrease in the barrier height leads to an increase in the collector current. The region C can be controlled to be either wide or narrow (or null) by controlling the degree of depletion of the base region. When charge carriers from the emitter region diffuse into the base region, the collector current will follow an exponential law in a small drain voltage region. If the resistance influences the carrier transport, a resistive characteristic may appear also. When the base region is perfectly depleted only by the built-in potential, the application of a collector voltage will immediately lower the potential barrier, so that the collector current easily becomes large. In the punch-through bipolar transistor, the base region potential is basically capacitatively controlled by the gate bias voltage, so that the potential barrier is usually lowest at the center of the channel.

As can be seen from the above statement, the punch-through bipolar transistor can be used in the same mode as that of the conventional bipolar transistor. Namely, the collector current can be controlled by the forward base bias voltage as well as by the collector voltage.

The thickness of the barrier layer should be determined, by considering the desired output current. When a large load current is required, e.g. for driving a TTL gate, the barrier layer should be formed sufficiently thin and at a site sufficiently near the emitter region.

Similar to the previous embodiments, various integrated circuits including the above-mentioned punch-through transistor can be formed.

Figure 23:
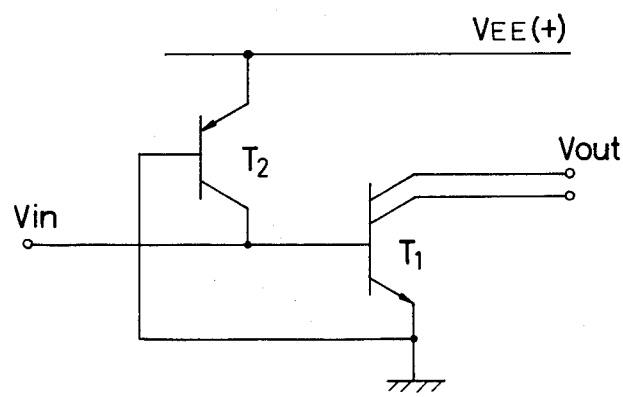
FIG. 23 is a circuit diagram of the semiconductor integrated circuit structure shown in FIGS. 20 and 21.

FIG. 23 shows a circuit diagram of the IIL circuit structures of FIGS. 20 and 21, comprising the punch-through driver transistor $T_1$ and a lateral bipolar injector transistor $T_2$. Structure of the integrated semiconductor device can be altered or modified according to the usual knowledge and the preceding description. The injector transistor $T_2$ may be replaced by a usual field effect transistor, a static induction transistor, or a punch-through transistor. Also, it is possible to form the injector transistor $T_2$ by the punch-through transistor, and the driver transistor $T_1$ by a static induction transistor.

Figure 24:
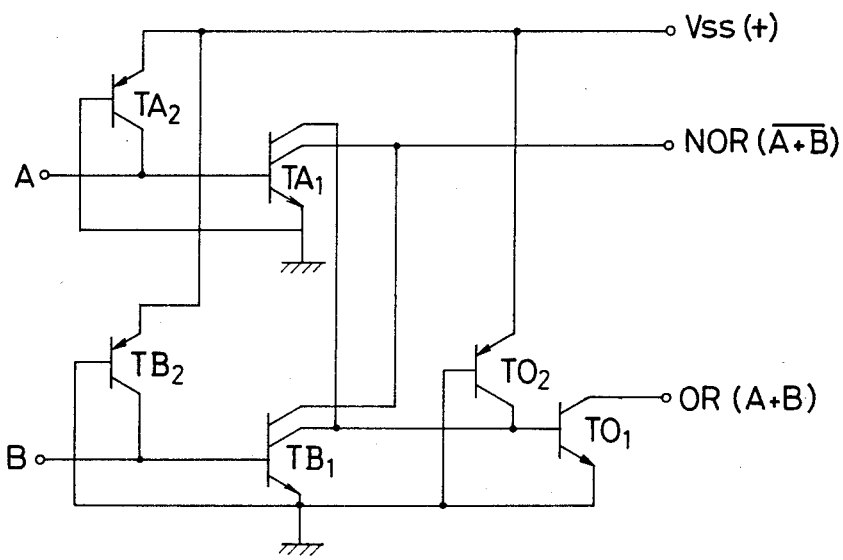
FIG. 24 is a circuit diagram of NOR and OR gate circuit according to another embodiment of the present invention.

All types of logic circuits can be formed by appropriately combining a plurality of this IIL circuit unit. FIG. 24 shows a NOR-OR circuit comprising three IIL units. Two inputs are applied to two IIL units, respectively. A pair of outputs of the two input IIL units are combined to supply an NOR output, while another pair of similar outputs of the two IIL units are supplied to an output IIL unit to generate an inverted NOR signal, i.e. an OR signal, at the drain of the output driver transistor $TO_1$.

Figure 25:
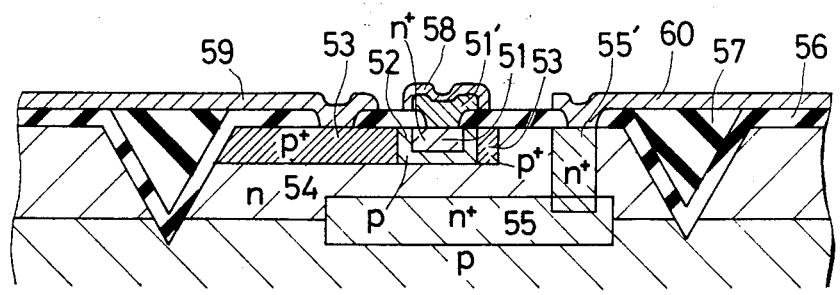
FIG. 25 is a diagrammatic cross-section of a semiconductor device according to another embodiment of the present invention.

FIG. 25 shows an example of a punch-through transistor having a substantially or completely depleted base region which, in turn, forms a thin potential barrier layer for the carriers in the emitter region. On a p type substrate, there are formed an n+ type region 55 and also an n type region 54 both serving as a collector region. A p type base region 52 is surrounded by a p+ type control electrode region 53. An n+ type emitter region 51 is formed in the p type base region 52. An n+ type region 55′ for extracting collector electrode is formed from the surface to the n+ type collector region 55. An emitter electrode is formed with a doped polycrystalline silicon region 51′ and a metal film 58 is formed thereon. A base electrode 59 and a collector electrode 60 are formed of metal films. The transistor is isolated, by cut-away grooves in the sideway and also by the pn junction, from the substrate. The surfaces of the semiconductor body excepting the electrode contacting area are covered with a passivation film 56, for example formed with silicon oxide, silicon nitride, aluminium oxide or the combinations thereof. The cutaway or recessed grooves are filled with an insulating material, for example of an oxide region, a high resistivity polycrystalline silicon or insulating resin such as polyimid. The impurity concentration of the n+ type emitter region 51 is of the order of $10^{18}$ to $10^{21}$ cm$^{-3}$, that of the p type base region 52 is of the order of $10^{12}$ to $10^{16}$ cm$^{-3}$, that of the n type collector region is of the order of $10^{14}$ to $10^{17}$ cm$^{-3}$, that of the base electrode-extracting p+ type region 53 is of the order of $10^{16}$ to $10^{21}$ cm$^{-3}$ and that of the n+ type collector region 55 is of the order of $10^{17}$ to $10^{20}$ cm$^{-3}$. The thickness and the impurity concentration of the p type base region 52 is so selected that the base region 52 can be substantially or completely pinched off by the built-in potentials on both sides.

It will be apparent that various modifications and alterations are possible in this example. For example, the isolating recessed grooves may have any shape of their cross sections. A pnp transistor can be formed by simply reversing all of the conductivity types. Only the required condition of designing is that the base region is substantially or completely depleted and that it leaves a thin potential barrier layer in the current path in a main operative region of the transistor.

The punch-through transistor having this feature has the advantages that the minority carrier storage effect can be reduced very small and that the base capacitance (both the emitter-base and the base-collector capacitances) can be reduced greatly. These advantages provide a very high speed operation, and furthermore they can be exhibited remarkably when used in an integrated circuits. All the currently existing bipolar integrated circuit techniques, such as ECL, EFL, NTL, DTL, RTL, TTL, static RAM, dynamic RAM, and ROM can be directly applied so as to use the punch-through transistors described above. Detailed description of embodiments of typical types of the integrated semiconductor circuits will be described hereinbelow.

Figure 26:
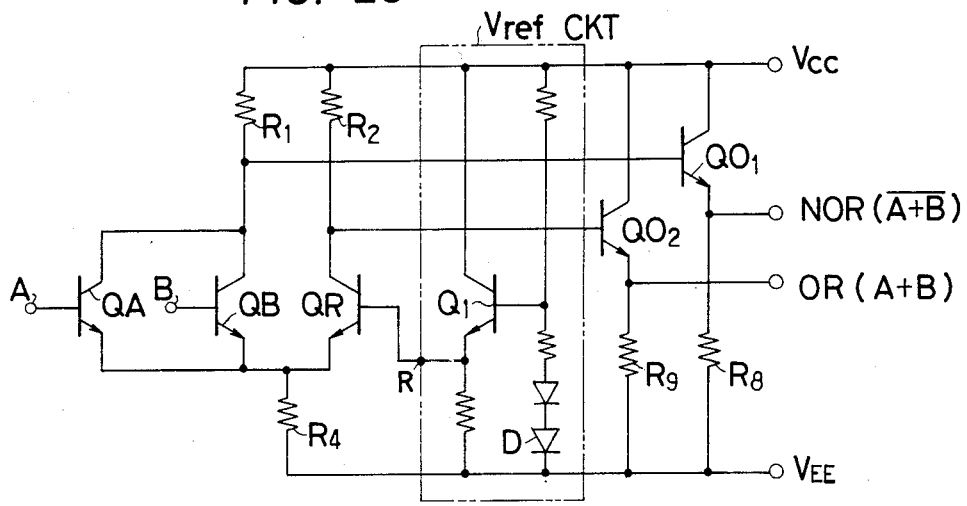
FIGS. 26 and 27 are circuit diagrams of NOR and OR gate circuits according to embodiments of the present invention.

FIG. 26 shows an emitter-coupled logic (ECL) circuit according to an embodiment of the present invention. Two inputs A and B are applied to bipolar transistors QA and QB of the punch-through type, and the NOR logic and OR logic outputs are provided through bipolar transistors $QO_1$ and $QO_2$ of the punch-through type. In this embodiment, the bipolar transistors excepting the one used in the reference voltage circuit are of the punch-through type, although some of which may be replaced by the usual bipolar transistors.

Figure 27:
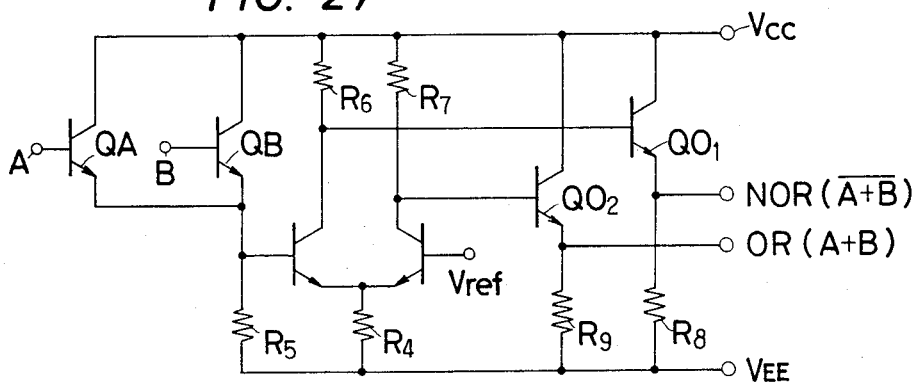

FIG. 27 shows another emitter-coupled logic (ECL) circuit according to another embodiment of the present invention. Collectors of the input transistors QA and QB are directly connected to the supply voltage line $V_{cc}$, hence the voltage change of these collector regions is eliminated, and the influence of the capacitances accompanying these regions are eliminated, thereby providing an improved high-speed operation of the circuit as compared with the device of FIG. 26.

Figure 28:
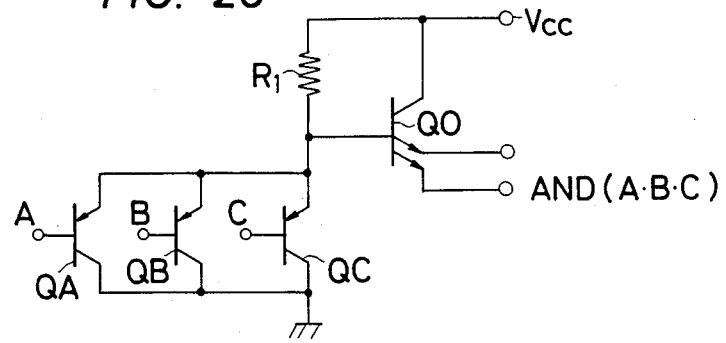
FIG. 28 is a circuit diagram of an emitter-follower logic (EFL) circuit according to another embodiment of the present invention.

FIG. 28 shows an emitter-follower logic (EFL) circuit according to an embodiment of the present invention. Three inputs A, B and C are applied through bipolar transistors. QA, QB and QC, respectively, and AND logic outputs are given through a multi-source output bipolar transistor QO. In this embodiment, bipolar transistors of both the pnp and the npn types are mixedly used to form a 3-input AND gate. This embodiment is composed of a rather small number of semiconductor elements and a large number of electrodes are connected to constant voltage supplies. Therefore, power dissipation is small, and an enhanced high-speed operation is provided. Furthermore, the integration density can be greatly improved. The resistor $R_1$ can be effectively replaced by a parallel connection of a resistor and a constant voltage device such as a static induction transistor as described before.

Figure 29:
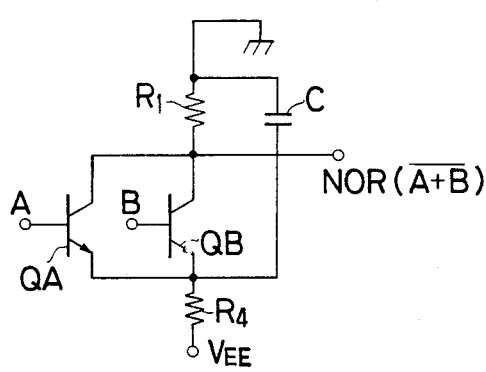
FIG. 29 is a circuit diagram of a non-threshold logic (NTL) circuit according to another embodiment of the present invention.

FIG. 29 shows a non-threshold logic (NTL) circuit according to an embodiment of the present invention, wherein two inputs A and B are applied to input transistors QA and QB of the punch-through type to provide a NOR logic output. Furthermore, since the minority carrier storage in the base region is negligibly small, the capacitor C can be dispensed with. Furthermore, as mentioned above, resistors $R_1$ and $R_4$ can be effectively replaced by constant voltage circuitries as shown in FIG. 15B.

Figure 30:
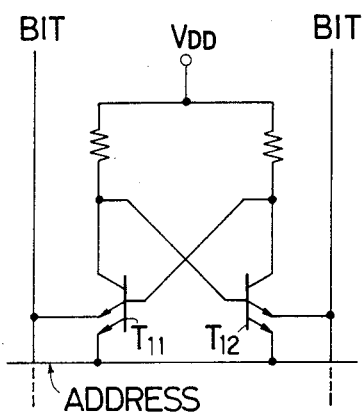
FIG. 30 is a circuit diagram showing a static random access memory (RAM) cell according to another embodiment of the present invention.

FIG. 30 shows a static random access memory composed of punch-through bipolar transistors according to an embodiment of the present invention. Transistors $T_{11}$ and $T_{12}$ are connected to the address lines and to the read and write lines through the emitters.

The bipolar transistor having a substantially or completely depleted base region, on one hand, can be used as a substitute of a usual bipolar transistor, and on the other hand, as a substitute of a static induction transistor of the forward gate bias type. Thus, all the circuits utilizing these transistors can be formed with such bipolar transistors, while maintaining the advantages of both types.

Figure 31A:
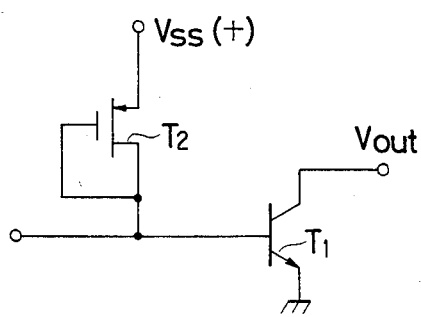
FIG. 31A is a circuit diagram showing an IIL inverter circuit according to another embodiment of the present invention.
Figure 31B:
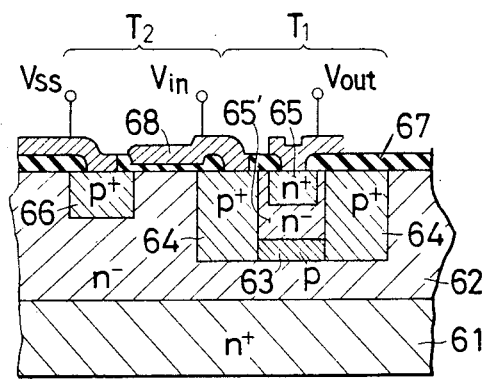
FIG. 31B is a diagrammatic cross-section of a semiconductor integrated circuit structure embodying the circuit of the present invention.

FIGS. 31A and 31B show an IIL inverter circuit diagram and a diagrammatic cross-sectional view of a semiconductor integrated circuit structure embodying this circuit according to an embodiment of the present invention. A metal-oxide-semiconductor field effect transistor (MOS FET) is used as an injector transistor $T_2$, and a bipolar transistor of punch-through type is used as a drive transistor $T_1$. The number of output terminals can be increased practically arbitrarily. The injector transistor $T_2$ is not limited to an enhancement mode FET but it may be depression mode FET or a bipolar transistor. In FIG. 31B, the injector transistor $T_2$ is formed with a p+ type source region 66, an n− type region 62, a p+ type drain region, and a common gatedrain electrode 68, whereas a driver transistor is formed with an n+ type emitter region 61, an n− type emitter region, a thin p type base region 73, a p+ type gate region 64, an n− type collector region 65′, an n+ type collector region 65 and a collector electrode 67. The base region 63 may be formed close or adjacent to the emitter region 61 to provide a large output current. In such a case, the p+ type gate region 64 may be indented to lower the emitter-base capacitance.

Figure 32A:
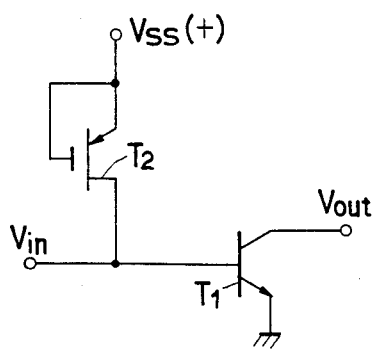
FIG. 32A is a circuit diagram showing an IIL inverter circuit according to another embodiment of the present invention.
Figure 32B:
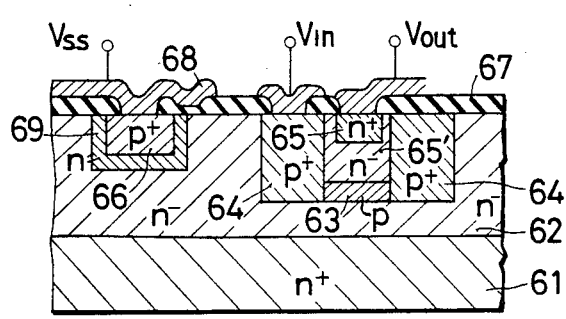
FIG. 32B is a diagrammatic cross-section of a semiconductor integrated circuit structure embodying the circuit of FIG. 32A.

FIGS. 32A and 32B show another ITL inverter circuit, and a diagrammatic cross-section of a semiconductor integrated circuit embodying this circuit according to another embodiment of the present invention, wherein a MOS SIT is used as the injector transistor $T_2$, and a bipolar transistor of the punch-through type is used as the driver transistor $T_1$. The structure of FIG. 32B is almost similar to that of FIG. 31B. In FIG. 32B, reference numeral 69 indicates the channel region provided with a metal-oxide-semiconductor gate. As described above, various combinations of IIL circuits provide various types of logic circuits capable of providing high speed switching operations at low power dissipation.

Figure 33A:
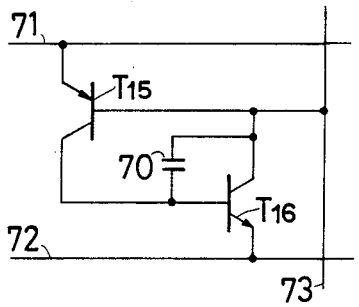
FIG. 33A is a circuit diagram showing a dynamic random access memory cell according to another embodiment of the present invention.
Figure 33B:
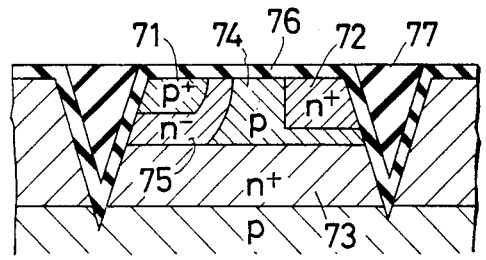
FIG. 33B is a diagrammatic cross-section of a semiconductor integrated circuit structure embodying the circuit of FIG. 3A.

FIGS. 33A and 33B show a dynamic random access memory cell circuit diagram using bipolar transistor of the punch-through type according to the present invention and a diagrammatic cross-section of a semiconductor integrated circuit structure embodying this circuit according to an embodiment of the present invention. Word lines or address lines are indicated by 71 and 72, and a bit line or data line is indicated by 73. A lateral pnp type transistor $T_{15}$ comprises a p+ type region 71, an n− type region 75 and a p type region 74, which form the emitter, the base and the collector, respectively. Furthermore, an npn type transistor $T_{16}$ is composed of an emitter region 72, a base region 74 and a collector region 73. The p+ type region 71 and the n+ type region 72 form the word lines or address lines. The n+ type region 73 represents the bit line or the data line. Electric charge is stored in a capacitor formed between the base and the collector of the transistor $T_{16}$. This structure can be applied to form a matrix of a desired number of units so as to compose a dynamic random access memory. The p type region 74 between the n+ type region 72 and the n+ type region 73 is in the state of about being pinched off at zero gate bias. It is obvious that the pair of the n+ type region 73 and the p type region 74 as well as the pair of the n+ type region 72 and the p type region 74 are not necessarily disposed contiguous to each other.

Figure 34A:
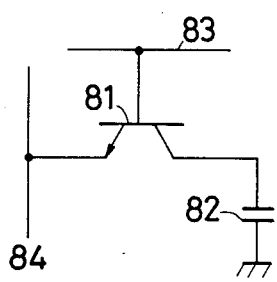
FIG. 34A is a circuit diagram showing a dynamic random access memory (RAM) cell according to another embodiment of the present invention.
Figure 34B:
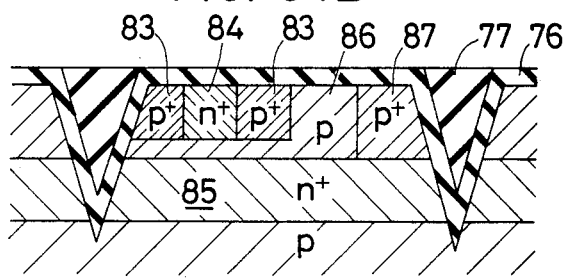
FIG. 34B is a diagrammatic cross-section of a semiconductor integrated circuit structure embodying the circuit of FIG. 34A.

FIGS. 34A and 34B show a dynamic random access memory (RAM) cell circuit and a corresponding cross-section of a semiconductor integrated circuit structure, respectively, according to the present invention. A dynamic RAM cell can be composed of a bipolar transistor which has a perfectly depleted base region. When the base region is perfectly depleted, the "on-off" control of the transistor can be accomplished by varying capacitively the height of the potential barrier without such need to let an electric current to flow through the base region as noted in conventional bipolar transistors. Reference numeral 81 indicates a bipolar transistor of the punch-through type, and numeral 82 in FIG. 34A represents a capacitor formed with the p type region 86, the p+ type region 87 and the $n^{30}$ type region 85 shown in FIG. 34B. The word line or address line is indicated by reference numeral 83, and the bit line or data line is represented by numeral 84. The base region of the bipolar transistor 86 is completely pinched off, and the potential barrier is controlled by the base voltage, i.e. the word line signal, to accomplish the "on-off" control of the transistor, and hence to accomplish read and write operations of the memory cell.

Furthermore, the above-mentioned structure can be applied as well to a three-transistor dynamic random access memory cell structure, a four-transistor dynamic random access memory cell structure and to a six-transistor static random access memory cell structure (disclosed in my pending Japanese Patent Application No. 52-4633). It is also possible to compose a read-only memory, in which data are written in an insulating film during the mask pattern process. It is also possible to form a shift register by the cells of this embodiment (disclosed in my pending Japanese Patent Application No. 52-4633). The memory cells shown in FIGS. 33A, 33B, 34A and 34B can provide high-speed read and write operations at a low power dissipation.

Figure 35:
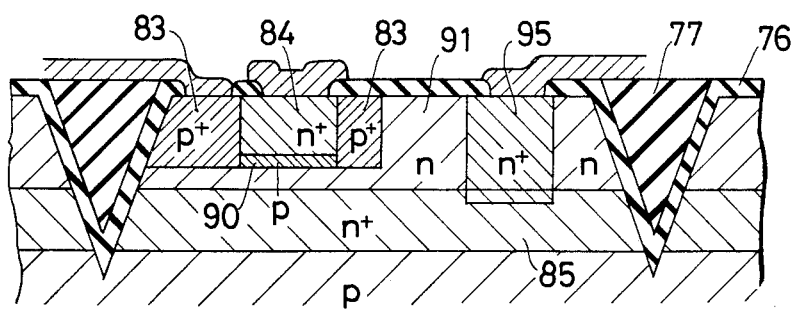
FIGS. 35 and 36 are diagrammatic cross-sections showing structures of the semiconductor device according to embodiments of the present invention.

FIG. 35 shows an almost constant voltage device of a planar structure according to an embodiment of the present invention. The bipolar transistor aimed to serve as a constant voltage device is controllable by a base voltage. This constant voltage device is similar to the constant voltage static induction transistor, in which the current change can cause practically no change in the output voltage (disclosed in my pending Japanese Patent Application filed on Feb. 7, 1977, entitled "Integrated semiconductor device"). In the illustrated device, the emitter is formed in the neighborhood of the collector, and thus the series resistance and the collector resistance are small. Thereby, the collector voltage can easily control the potential barrier, and thus a constant voltage device can be composed.

The p type region 90 is formed between the emitter region 84 and the collector region 85 and is completely depleted, thereby the potential barrier is reduced immediately after the application of a collector voltage. Amount of current flow can also be controlled by the length of the region 90 extending in the direction perpendicular to the surface of the sheet of drawing. Recommended impurity concentrations are as follows: about $10^{18}$–$10^{<}$ cm$^{-3}$ in the n+ type regions 84, 85 and 95; about $10^{16}$–$10^{21}$ cm$^{-3}$ in the p+ type region 83; about $10^{13}$–$10^{17}$ cm$^{-3}$ in the n type region 91; and about $10^{13}$–$10^{17}$ cm$^{-3}$ in the p type region 90. Apparently, these values can be varied also according to the intended use and to the available manufacturing technique.

Figure 36:
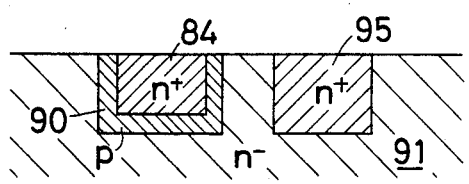

FIG. 36 shows another structure of an almost constant voltage device of a lateral structure according to an embodiment of the present invention. Description made in connection with FIG. 35 can be applied also to this embodiment. In this case, the impurity concentration of an n− type region 92 is about $10^{12}$ to $10^{15}$ cm$^{-3}$. The thickness of the p type region 90 may be arranged to be thin for the purpose of providing a good characteristic of a constant voltage device.

Figure 37:
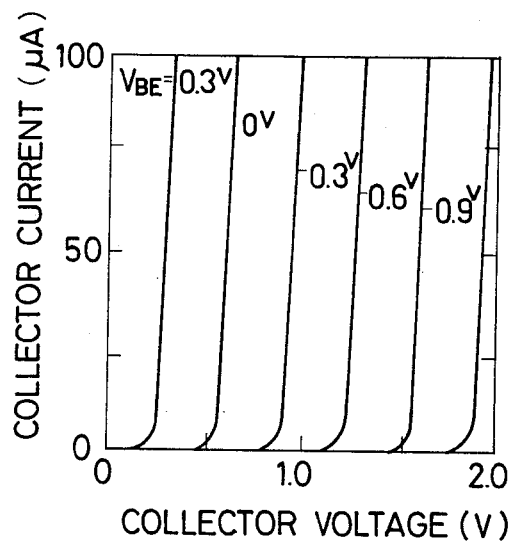
FIG. 37 is a diagram showing I-V characteristic curves of the semiconductor device according to the embodiments shown in FIGS. 35 and 36.

FIG. 37 shows characteristic curves of the collector current ($\mu$A) vs. collector voltage (V) representing a performance of an example of the constant voltage device according to the embodiments mentioned above. The characteristics are widely changeable in accordance with the selections of the width (thickness), the impurity concentration and the area of the base region. For example, a high value of the constant voltage at $V_{BE}=0$ can be obtained by narrowing the base region.

When such a constant voltage bipolar transistor is used as an injector transistor, the voltage level can be precisely controlled without being influenced by the number of transistors connected to the input gate (i.e. the number of the fan-in). Therefore, the above-mentioned constant voltage transistors can be used advantageously in logic gate structures, as described previously in connection with the static induction transistor IC.

Figure 38:
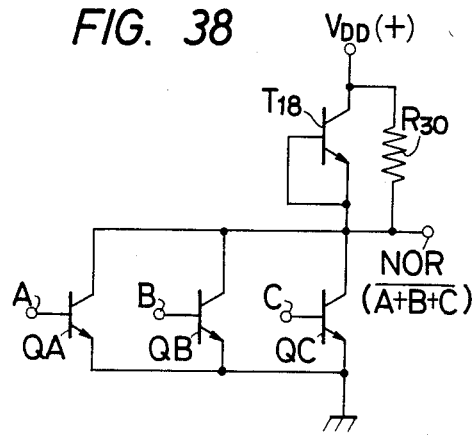
FIG. 38 is a circuit diagram of NOR gate circuit according to another embodiment of the present invention.

FIG. 38 shows an NOR gate circuit with three inputs according to an embodiment of the present invention. The supply voltage is applied through a parallel connection of a bipolar transistor $T_{18}$ and a resistor $R_{30}$. The output voltage level is hardly influenced by the number of the inputs. This means that the NOR logic output voltage level in case of the arrival of one "1" input signal does not differ from that in case of the arrival of three "1" input signals.

Figure 39:
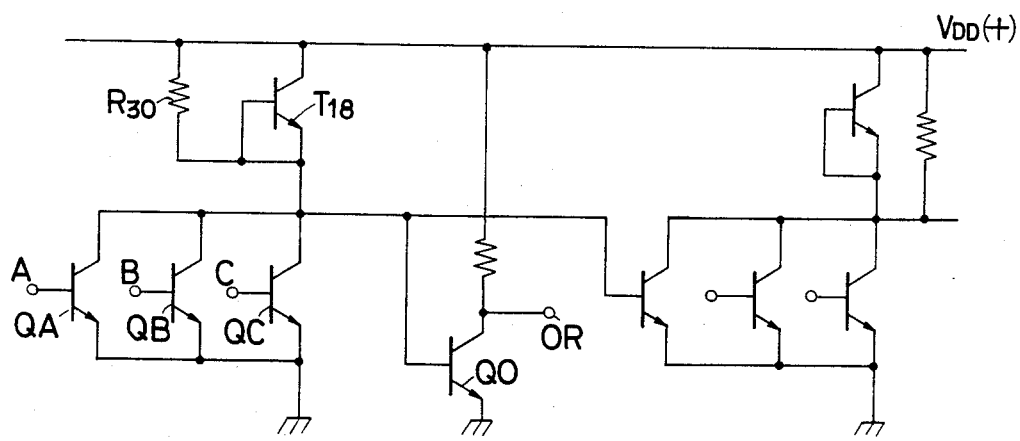
FIG. 39 is a partial circuit diagram of a general logic circuit including the circuit shown in FIG. 38.

FIG. 39 shows part of a general logic circuit according to an embodiment of the present invention. Three inputs A, B and C are applied to three input transistors QA, QB and QC, respectively, to provide an NOR signal at the common drain. This NOR signal is directly supplied to the subsequent stage on the one hand, and is inverted through an inverter transistor QO into an OR signal on the other hand. The use of this OR signal can be arbitrarily determined.

Although description has been made on various embodiments hereinabove, the scope of the present invention is never limited to those mentioned above. For example, the thin base region of the punch-through bipolar transistor may be connected directly to a metal electrode (i.e. Schottkey electrode), or to a metal electrode through an insulating film (MIS electrode). The transistors of both the SIT type and the punch-through type according to the present invention both can provide a high-speed operation while they can serve as a substitute of bipolar transistors even in part of an entire system. The conventional circuit technique of the bipolar transistor can be directly utilized to form higher-speed integrated circuits utilizing those transistors according to the present invention. Also, the semiconductor material used in the present invention may be selected from silicon, germanium, III-V compounds and other semiconductor materials. For example, gallium arsenide and other wide band gap semiconductors are suitable for providing a higher barrier hieght, i.e. a wider dynamic range.

Furthermore, the transistors and the IC's according to the present invention can be manufactured by utilizing the conventional manufacturing techniques. For example, the ion implanation techniques can be advantageously utilized.

What is claimed is:

1. In a semiconductor device of the type including:
   a current channel region including at least first and second relatively low impurity concentration semiconductor regions of different impurity concentrations;
   low resistivity carrier injecting and low resistivity carrier extracting semiconductor regions of a first conducitivity type; and
   low resistivity controlling semiconductor regions of a second conductivity type opposite to said first conductivity type provided adjacent to said current channel region and adapted to be applied with a controlling voltage,
   said first semiconductor region of said current channel region being of the second conductivity type, and said second semiconductor region of said current channel region being of the first conductivity type,
   the improvement wherein:
   said first semiconductor region of said current channel region has an impurity concentration higher than that of said second semiconductor region of said current channel region and a thickness smaller than that of said second semiconductor region, and
   said device includes means, comprising said channel first region, for generating a depletion layer extending across said current channel region and having a predetermined thickness in the direction of carrier movement in response to zero controlling voltage such that the current channel region is completely depleted at zero controlling voltage, and providing a potential barrier in the current channel region for charge carriers moving from said carrier injecting semiconductor region, the height of the potential barrier being capacitively controllable at least by the voltage applied to said carrier extracting semiconductor region, in a main operative state of the semiconductor device.

2. A semiconductor device according to calim 1, wherein
   said first semiconductor region of said current channel region is contiguous with said carrier extracting region which serves as a drain region, and
   said semiconductor region is contiguous with said carrier injecting region which serves as a source region.

3. A semiconductor device according to claim 1, wherein: said current channel region further comprises:
   a third semiconductor region of said first conductivity type disposed between said carrier extracting semiconductor region and said first semiconductor region and having an impurity concentration similar to that of said second semiconductor region and lower than that of said first semiconductor region.

4. A semiconductor device according to claim 1, wherein:
   said first semiconductor region of said current channel region is contiguous with said injecting region which serves as a source region, and
   said second semiconductor region is contiguous with said carrier extracting region which serves as a drain region.

5. A semiconductor device according to claim 1, wherein:
   said current channel region further comprises:
   a third semiconductor region of said first conductivity type disposed between said carrier injecting semiconductor region and said first semiconductor region and having an impurity concentration similar to that of said second semiconductor region and lower than that of said first semiconductor region.

6. In a semiconductor integrated circuit structure of the type including a plurality of semiconductor elements, at least one of said semiconductor elements comprising:
   a current channel region including at least first and second relatively low impurity concentration semiconductor regions;
   low resistivity carrier injecting and low resistivity carrier extracting semiconductor regions of a first conductivity type and
   low resistivity controlling semiconductor regions of a second conductivity type opposite to said first conductivity type provided adjacent to said current channel region and adapted to be applied with a controlling voltage, said channel first semiconductor region of said current channel region being of the second conductivity type, and said second semiconductor region of said current channel region being of the first conductivity type, the improvement wherein:

said channel first semiconductor region has an impurity concentration higher than that of said channel second semiconductor region and a thickness smaller than that of said channel second semiconductor region, and said device includes means, comprising said channel first region, for generating a depletion layer extending across said current channel region and having a thickness in the direction of carrier movement in response to zero controlling voltage such that the current channel region is completely depleted at zero controlling voltage, and providing a potential barrier in the current channel region for charge carriers moving from said carrier injection semiconductor region serving as electrode, the height of the potential barrier being capacitively controllable at least by the voltage applied to said carrier extracting semiconductor region in a main operative state of the semiconductor device.

7. A semiconductor integrated circuit structure according to claim 6, wherein:

said first semiconductor region of said current channel region is contiguous with said carrier extracting region which serves as a drain region, and said semiconductor region is contiguous with said carrier injecting region which serves as a source region.

8. A semiconductor integrated circuit structure according to claim 6, wherein:

said integrated circuit comprises an integrated injection logic circuit including an injector transistor and said at least one semiconductor element, connected to said injector transistor as a driver transistor;

said injector transistor being formed of a bipolar transistor having a current extraction region, said semiconductor element controlling electrode regions and said bipolar transistor current extraction region being formed by an electrically common region.

9. A semiconductor integrated circuit structure according to claim 6, wherein:

said integrated circuit comprises an integrated injection logic circuit including an injector transistor and said at least one semiconductor element, connected to said injector transistor as a driver transistor;

said injector transistor comprising an insulated gate field effect transistor having a current extracting region, said semiconductor element controlling electrode regions and said current extracting region of said injector transistor being formed by an electrically common region.

10. A semiconductor integrated circuit structure according to claim 6, wherein:

said integrated circuit comprises an integrated injection logic circuit including an injector transistor and said at least one semiconductor element, connected to said injector transistor as a driver transistor;

said injector transistor comprising a static induction transistor having a current extracting region, said semiconductor element controlling electrode regions and said current extracting region of said static induction transistor being formed by an electrically common region.

11. A semiconductor integrated circuit structure according to claim 6, wherein:

the integrated circuit includes at least one resistance element, and wherein:

said resistance element comprises a parallel connection of a resistor and said at least one semiconductor element.

12. A semiconductor integrated circuit structure according to claim 6, wherein:

said first semiconductor region of said current channel region is contiguous with said carrier injecting region which serves as a source region, and said second semiconductor region is contiguous with said carrier extracting region which serves as a drain region.

13. A semiconductor integrated circuit structure according to claim 6, wherein:

said current channel region further comprises:

a third semiconductor region of said first conductivity type disposed between said carrier injecting semiconductor region and said first semiconductor region and having an impurity concentration similar to that of said second semiconductor region and lower than that of said first semiconductor region.

14. A semiconductor integrated circuit structure according to claim 6, wherein:

said at least one semiconductor element includes a plurality of current channel regions and a plurality of corresponding carrier extracting regions.

15. A semiconductor integrated circuit structure according to claim 6, wherein: the number of said at least one semiconductor element is at least two, and at least two of said at least two semiconductor elements are connected in parallel.

16. A semiconductor integrated circuit structure according to claim 7, wherein:

said integrated circuit embodies a memory matrix of rows and columns including memory cells at cross points of said rows and columns, and wherein:

at least one of said memory cells includes said semiconductor element.

17. A semiconductor integrated circuit structure according to claim 16, wherein: said semiconductor element current injecting region is connected to one of said rows and columns.

18. A semiconductor integrated circuit structure according to claim 16, wherein: said memory cell comprises said at least one semiconductor element and a capacitance connected to said carrier extracting electrode means.

19. A semiconductor integrated circuit structure according to claim 7, wherein:

at least one of said memory cells comprises a first and a second transistor, each having a carrier injecting and a carrier extracting region and a current channel region, said carrier injecting and extracting regions of said first transistor being common to said carrier extracting and injecting regions of said second transistor, at least one of said first and second transistors being formed with said semiconductor element.

20. A semiconductor device formed in a semiconductor body having at least one principal surface said device comprising:
- a first semiconductor region of a first conductivity type and of high impurity concentration;
- a second semiconductor region of said first conductivity type and of low impurity concentration disposed adjacent to said first semiconductor region;
- a third semiconductor region of said first conductivity type and of high impurity concentration formed in said second semiconductor region adjacent to said principal surface, and adapted for application of a voltage thereto;
- a fourth semiconductor region of opposite conductivity type formed in said second semiconductor region interposed between said third and first semiconductor regions;
- said first, third and fourth semiconductor regions being relatively disposed in said semiconductor body to provide a controllable current path between said first and third regions through at least said fourth semiconductor region, and
- control means, responsive to control voltages applied thereto and including a fifth semiconductor region of said opposite conductivity type and of higher impurity concentration than said fourth region disposed adjacent to at least said fourth layer, for generating a depletion layer extending into at least said fourth semiconductor region and substantially depleting said fourth semiconductor region in response to zero control voltage to inhibit current flow along said current path, and selectively decreasing said depletion layer in response to forward control voltages with respect to said first region to permit current flow; to provide a potential barrier in said current path with respect to charge carriers moving between said first and third regions, the height of said potential barrier being a first value in response to zero control voltage, and capacitively controllable in accordance with said voltage applied to said third semiconductor region.

21. In a semiconductor device of the type including carrier injector, carrier extractor, control and channel semiconductor regions relatively disposed to define a controlled current path between said carrier injector and carrier extractor regions through said channel region, said carrier injector and carrier extractor regions being of a first conductivity type, said control region being of a second conductivity type and responsive to a control voltage applied thereto, said device further including a depletion layer in said channel region, the improvement wherein:
said device includes means, comprising a subregion of said second conductivity type and of lower impurity concentration than said control region disposed in said channel region adjacent to said control region and forming at least one p-n junction with said channel region, having a width equal to the width of said channel region, and
a predetermined thickness such that said subregion is completely depleted by a depletion layer extending from said p-n junction in response to zero volt control voltage, for presenting a potential barrier to charge carriers moving from said carrier injector to said carrier extrator region, said potential barrier having a first height in response to said zero voltage and capacitively varying in accordance with voltages applied to said carrier extractor region.

22. In a semiconductor device of the type including carrier injector, carrier extractor, control and channel semiconductor regions, relatively disposed to define a controlled current path between said carrier injector and carrier extractor regions through said channel region, said carrier injector, carrier extractor and channel regions being of a first conductivity type and at least said carrier extractor region being adapted for application of voltages thereto, said control region being of a second conductivity type opposite to said first conductivity type and responsive to a control voltage applied thereto, the improvement wherein said device further includes means, comprising an auxiliary control region of said second conductivity type and of an impurity concentration less than the impurity concentration of said control region, but higher than impurity concentration of the other current channel region, disposed contacting said channel and control regions, interposed across said current path, having predetermined thickness along said current path and width transverse to said current path, and being completely depleted in response to zero control voltage applied to said control region, for presenting a potential barrier to carriers moving from said carrier injector to said carrier extractor regions in response to zero control voltage applied to said control region, the height of said potential barrier being capacitively controllable by voltages applied to said carrier extractor region.

23. A semiconductor integrated circuit structure according to claim 22, wherein:
said current channel region further comprises:
a third semiconductor region of said first conductivity type disposed between said carrier extracting semiconductor region and said first semiconductor region and having an impurity concentration similar to that of said second semiconductor region and lower than that of said first semiconductor region.

* * * * *